United States Patent
Tsukamoto et al.

(10) Patent No.: US 10,873,050 B2
(45) Date of Patent: Dec. 22, 2020

(54) ORGANIC EL DISPLAY DEVICE AND ORGANIC EL DISPLAY DEVICE MANUFACTURING METHOD

(71) Applicant: Sharp Kabushiki Kaisha, Sakai (JP)

(72) Inventors: Yuto Tsukamoto, Sakai (JP); Seiichi Mitsui, Sakai (JP); Shinichi Kawato, Sakai (JP); Manabu Niboshi, Sakai (JP); Eiji Koike, Sakai (JP); Masanori Ohara, Sakai (JP); Asae Ito, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 333 days.

(21) Appl. No.: 16/088,458

(22) PCT Filed: Mar. 22, 2017

(86) PCT No.: PCT/JP2017/011530
§ 371 (c)(1),
(2) Date: Sep. 26, 2018

(87) PCT Pub. No.: WO2017/170063
PCT Pub. Date: Oct. 5, 2017

(65) Prior Publication Data
US 2020/0303670 A1 Sep. 24, 2020

(30) Foreign Application Priority Data
Mar. 29, 2016 (JP) ................. 2016-066709

(51) Int. Cl.
*H01L 51/50* (2006.01)
*H01L 27/32* (2006.01)
(Continued)

(52) U.S. Cl.
CPC ...... *H01L 51/5044* (2013.01); *H01L 27/3211* (2013.01); *H01L 51/5218* (2013.01);
(Continued)

(58) Field of Classification Search
CPC ............ H01L 51/5044; H01L 27/3211; H01L 51/5218; H01L 51/5221; H01L 51/56; H01L 2251/558
(Continued)

(56) References Cited

U.S. PATENT DOCUMENTS

| 5,693,428 A | 12/1997 | Fujii et al. |
| 2006/0163597 A1* | 7/2006 | Noda ................ H01L 33/58 |
| | | 257/98 |

(Continued)

FOREIGN PATENT DOCUMENTS

| JP | 8-315986 A | 11/1996 |
| JP | 2008-243437 A | 10/2008 |

(Continued)

OTHER PUBLICATIONS

Official Communication issued in International Patent Application No. PCT/JP2017/011530, dated Jun. 27, 2017.

*Primary Examiner* — Sheikh Maruf
(74) *Attorney, Agent, or Firm* — Keating & Bennett, LLP

(57) ABSTRACT

An organic EL display device with higher resolution, suppressed power consumption while being driven and low manufacturing cost, and no color mixing and color shifting between subpixels adjacent to each other is provided. In a B subpixel, a first separation layer is provided between a common blue-light-emitting layer and a common green-light-emitting layer. In a G subpixel, a second separation layer is provided between the common green-light-emitting layer and a common red-light-emitting layer.

18 Claims, 15 Drawing Sheets

(51) Int. Cl.
*H01L 51/52* (2006.01)
*H01L 51/56* (2006.01)
(52) U.S. Cl.
CPC .......... *H01L 51/5221* (2013.01); *H01L 51/56* (2013.01); *H01L 2251/558* (2013.01)
(58) Field of Classification Search
USPC ......................................................... 257/40
See application file for complete search history.

(56) References Cited

U.S. PATENT DOCUMENTS

| | | | | |
|---|---|---|---|---|
| 2007/0145350 A1* | 6/2007 | Kobori | ................... | H01L 27/322 257/13 |
| 2007/0228399 A1* | 10/2007 | Iwawaki | ............... | H01L 51/006 257/89 |
| 2008/0299365 A1* | 12/2008 | Choi | ...................... | H05B 33/14 428/213 |
| 2009/0261360 A1 | 10/2009 | Yasukawa et al. | | |
| 2011/0198624 A1* | 8/2011 | Matsushima | ....... | H01L 27/3246 257/88 |
| 2012/0080694 A1* | 4/2012 | Yoshida | .............. | H01L 51/5262 257/89 |
| 2012/0187386 A1* | 7/2012 | Matsumi | ............. | H01L 51/5056 257/40 |
| 2012/0261651 A1 | 10/2012 | Noto et al. | | |
| 2013/0320388 A1* | 12/2013 | Sekimoto | ............ | H01L 27/3246 257/99 |
| 2016/0072082 A1* | 3/2016 | Brooks | ................. | H01L 51/005 257/40 |
| 2016/0079314 A1* | 3/2016 | Seo | ..................... | H01L 51/0061 257/40 |
| 2016/0093678 A1* | 3/2016 | Seo | ..................... | H01L 51/5234 257/89 |
| 2017/0163010 A1 | 6/2017 | Nakanotani et al. | | |
| 2017/0194385 A1* | 7/2017 | Jung | ...................... | H01L 51/5056 |
| 2017/0331065 A1* | 11/2017 | Seo | ........................ | H01L 27/323 |

FOREIGN PATENT DOCUMENTS

| | | |
|---|---|---|
| JP | 4441883 B2 | 3/2010 |
| JP | 4915356 B2 | 4/2012 |
| JP | 2015-134920 A | 7/2015 |
| JP | 2016-25209 A | 2/2016 |
| JP | 2016-36055 A | 3/2016 |

* cited by examiner

ONLY R LIGHT EMISSION OR B LIGHT EMISSION IS POSSIBLE

ONLY R LIGHT EMISSION OR B LIGHT EMISSION IS POSSIBLE

LIGHT

ORGANIC EL DISPLAY DEVICE AND ORGANIC EL DISPLAY DEVICE MANUFACTURING METHOD

TECHNICAL FIELD

The disclosure relates to an organic EL display device and an organic EL display device manufacturing method.

BACKGROUND ART

Various flat panel displays have been developed. In particular, with its capability of achieving low power consumption and higher picture quality in a thinner profile, organic electro luminescence (EL) display devices have received great attention as superior flat panel displays and developed as candidates of achieving the next generation display technology.

Organic EL display devices are roughly classified into three kinds as described below depending on a structure of organic EL elements.

First one is an organic EL display device having organic EL elements configured to emit light in respective colors of subpixels formed through separately patterning vapor deposition performed three times for a red-light-emitting layer, a green-light-emitting layer, and a blue-light-emitting layer. In separately patterning vapor deposition, vapor deposition films are formed through vapor deposition performed a plurality of times in a shape corresponding to each of the subpixels having respective colors.

Next one is, as described in PTL 1, an organic EL display device equipped with a red-light-emitting layer, a green-light-emitting layer, and a blue-light-emitting layer vapor-deposited wholly and layered between a negative electrode and a positive electrode in all subpixels, as well as equipped with red, green, and blue color filters on the subpixels, for achieving full-color display based on white light emission.

Final one is, as described in PTL 2, an organic EL display device formed with organic EL elements configured to emit light in respective colors of subpixels by forming a blue-light-emitting layer as a common layer in all subpixels, by forming a green conversion layer configured to convert blue light into green light in green subpixels and a red conversion layer configured to convert blue light into red light in red subpixels, and by forming, in the subpixels, color filters for colors corresponding to the colors of the subpixels.

CITATION LIST

Patent Literature

PTL 1: JP 4915356 B (issued on Apr. 11, 2012)
PTL 2: JP 4441883 B (issued on Mar. 31, 2010)

SUMMARY

Technical Problem

FIGS. 20A and 20B are diagrams for describing problems in an organic EL display device having organic EL elements configured to emit light in respective colors of subpixels formed through separately patterning vapor deposition performed three times for a red-light-emitting layer, a green-light-emitting layer, and a blue-light-emitting layer.

FIG. 20A is a diagram illustrating forming, through separately patterning vapor deposition, of light-emitting layers for colors different from each other in subpixels adjacent to each other on a substrate. FIG. 20B is a diagram illustrating a degree of color mixing when a minute amount of a light-emitting dopant used to form a red-light-emitting layer is mixed into a green-light-emitting layer.

As illustrated in FIG. 20A, after a green-light-emitting layer 103G is vapor-deposited onto a substrate 100, when, to form a red-light-emitting layer 103R, vapor deposition particles emitted from a vapor deposition source 102 are vapor-deposited, via a vapor deposition mask 101, onto a red subpixel adjacent to a green subpixel formed with the green-light-emitting layer 103G, the vapor deposition particles emitted from the vapor deposition source 102 to form the red-light-emitting layer 103R may expand and enter into the green-light-emitting layer 103G formed on the adjacent subpixel, i.e., the green subpixel.

As described above, when the green-light-emitting layer 103G and the red-light-emitting layer 103R are layered on the green subpixel, controlling of luminescent colors becomes difficult.

When a vapor deposition material entered into the adjacent subpixel, i.e., the green subpixel, is a light-emitting dopant, even when its amount is minute, an electroluminescence light-emitting spectrum (hereinafter referred to as EL light-emitting spectrum) may be greatly negatively affected.

As illustrated in FIG. 20B, when a minute amount of a light-emitting dopant forming the red-light-emitting layer 103R mixes into the green-light-emitting layer 103G, a greater peak appears in a wavelength range of red light, leading to color mixing of green and red colors.

As described above, when organic EL elements included in subpixels emit light with mixed colors, display quality of the organic EL display device also lowers.

As described above, when performing separately patterning vapor deposition three times for a red-light-emitting layer, a green-light-emitting layer, and a blue-light-emitting layer, an enough vapor deposition margin is required, facing difficulty in achieving a high resolution organic EL display device.

According to the reasons described above, a vapor deposition material is strictly prevented from entering into adjacent subpixels. When performing separately patterning vapor deposition three times, it is required that a vapor-deposition angle be acute relative to a vapor-deposition direction, for example, leading to a greater distance between the vapor deposition mask 101 and the vapor deposition source 102. As a result, a vacuum chamber increases greatly in size, while efficiency of utilization of a vapor-deposition material lowers.

Due to limitations in opening precision and flatness of a vapor deposition mask used for separately patterning vapor deposition, it is further difficult to achieve higher resolution and an increase in apparatus size.

FIG. 21A is a view illustrating a schematic configuration of a white light emission organic EL element capable of achieving a full-color organic EL display device with combined color filters, described in PTL 1.

As illustrated in FIG. 21A, a white light emission organic EL element 111 includes a layered film 124 between a positive electrode 113 and a negative electrode 123 formed on a substrate 112. The layered film 124 is sealed by a sealing member 125 from above.

The layered film 124 is layered, from the positive electrode 113, with a hole injection layer 114, a hole transport layer 115, a red-light-emitting layer 116, a first intermediate layer 117, a blue-light-emitting layer 118, a second intermediate layer 119, a green-light-emitting layer 120, an electron transport layer 121, and an electron injection layer 122 in order.

However, the white light emission organic EL element 111 is disadvantageous in manufacturing cost due to a greater number of layers and combined color filters, for example, in addition to its higher power consumption while being driven.

FIG. 21B is a view illustrating a schematic configuration an organic EL display device 200 including color conversion layers 203G and 203R described in PTL 2.

As illustrated in FIG. 21B, in each of subpixels (R subpixel, G subpixel, and B subpixel) on a substrate 204, a counter electrode layer 205, a function layer 206 including a blue-light-emitting layer, and an optically transparent electrode layer 207 are layered in this order per subpixel.

On the other hand, on a substrate 201 facing the substrate 204, a blue color filter 202B is provided at a position corresponding to the B subpixel. A green color filter 202G and the green conversion layer 203G configured to convert blue light into green light are layered in this order at a position corresponding to the G subpixel. A red color filter 202R and the red conversion layer 203R configured to convert blue light into red light are layered in this order at a position corresponding to the R subpixel.

The counter electrode layer 205 has a layered structure with a reflective electrode layer and a transparent electrode layer. The reflective electrode layer abuts the substrate 204.

FIG. 21B is a view illustrating a schematic configuration of the organic EL display device 200, and is illustrated with the counter electrode layer 205 formed over all the subpixels at a constant film thickness. However, in an actual case, only the transparent electrode layer in the G subpixel and the R subpixel is formed at a constant film thickness. The transparent electrode layer in the G subpixel and the R subpixel is formed thicker in film thickness than the transparent electrode layer in the B subpixel.

That is, with a set optical distance between the reflective electrode layer in the counter electrode layer 205 and the light-emitting layer in the function layer 206 in the B subpixel, blue light being emitted interferes. On the other hand, with a set common distance in the G subpixel including the green conversion layer 202G, as well as with a set common distance in the R subpixel including the red conversion layer 202R, the green conversion layer 202G and the red conversion layer 202R can each convert light into light with a predetermined wavelength, and the light can be extracted at highest intensity.

As described above, the organic EL display device 200 has a structure of extracting, as is, light optimized through optical interference by blue light emitted from the blue-light-emitting layer in the function layer 206 via the blue color filter 202B, or of extracting light color-converted via the green conversion layer 202G and the green color filter 202G or the red conversion layer 202R and the red color filter 202R.

However, in the configuration described above, due to the uneven film thickness of the layered film, light extraction efficiency may change significantly, and blue light to be emitted obliquely leads to color mixing and color shifting, facing difficulty in achieving higher resolution.

Further, to allow the red conversion layer 202R to absorb blue light, it is required that the blue light be shifted to longer wavelength side, resulting in a significant decrease in light emission intensity.

In view of the above described problems, the disclosure has an object to provide an organic EL display device with higher resolution, suppressed power consumption while being driven and low manufacturing cost, and no color mixing and color shifting between subpixels adjacent to each other, and an organic EL display device manufacturing method. The organic EL display device manufacturing method is capable of producing an organic EL display device with higher resolution, suppressed power consumption while being driven and low manufacturing cost, and no color mixing and color shifting between subpixels adjacent to each other, without leading to a great increase in size of a manufacturing apparatus and a decrease in efficiency of utilization of a vapor-deposition material.

Solution to Problem

To solve the above described problems, an organic EL display device according to the disclosure includes a plurality of pixels. The plurality of pixels each include a first subpixel, a second subpixel, and a third subpixel. The first, second, and third subpixels are configured to emit light with peak wavelengths different from each other. The first, second, and third subpixels each include a positive electrode, a negative electrode, and a light-emitting layer formed between the positive electrode and the negative electrode. Either of the positive electrode and the negative electrode is a reflective electrode or includes a reflective layer. Another of the positive electrode and the negative electrode is a transparent electrode or a translucent electrode configured to transmit the light with peak wavelengths different from each other. The light-emitting layer is a layered film including a first fluorescence light-emitting layer configured to emit light with a longest peak wavelength, a second fluorescence light-emitting layer configured to emit light with a shortest peak wavelength, and a third fluorescence light-emitting layer configured to emit light with a peak wavelength between the longest peak wavelength of the first fluorescence light-emitting layer and the shortest peak wavelength of the second fluorescence light-emitting layer. The first fluorescence light-emitting layer, the second fluorescence light-emitting layer, and the third fluorescence light-emitting layer are each formed as a single common layer in the plurality of pixels. The first fluorescence light-emitting layer is arranged above or below the second fluorescence light-emitting layer and the third fluorescence light-emitting layer. In the first subpixel, a first separation layer without including a light-emitting material is provided between the second fluorescence light-emitting layer and the third fluorescence light-emitting layer. In the second subpixel, a second separation layer without containing a light-emitting material is provided between the first fluorescence light-emitting layer and a fluorescence light-emitting layer lying adjacent to the first fluorescence light-emitting layer.

According to the configuration, an organic EL display device with higher resolution, suppressed power consumption while being driven and low manufacturing cost, and no color mixing and color shifting between subpixels adjacent to each other can be achieved.

To solve the above described problems, an organic EL display device manufacturing method for producing an organic EL display device including a plurality of pixels each including a first subpixel, a second subpixel, and a third subpixel configured to emit light with peak wavelengths different from each other, according to the disclosure, includes forming a positive electrode, forming a negative electrode, and forming a light-emitting layer. In the forming a light-emitting layer, a first fluorescence light-emitting layer configured to emit light with a longest peak wavelength, a second fluorescence light-emitting layer configured to emit light with a shortest peak wavelength, and a third fluorescence light-emitting layer configured to emit light with a peak wavelength between the longest peak wavelength of the first fluorescence light-emitting layer and the shortest peak wavelength of the second fluorescence light-emitting layer are vapor-deposited over the plurality of pixels to allow the first fluorescence light-emitting layer to lie above or below the second fluorescence light-emitting layer and the third fluorescence light-emitting layer. Between the second fluorescence light-emitting layer and the third fluorescence light-emitting layer, a first separation layer without containing a light-emitting material is separately patterning vapor deposited onto the first subpixel. Between the first fluorescence light-emitting layer and a fluorescence light-emitting layer lying adjacent to the first fluorescence light-emitting layer, a second separation layer without containing a light-emitting material is separately patterning vapor deposited onto the second subpixel.

According to the organic EL display device manufacturing method, an organic EL display device with higher resolution, suppressed power consumption while being driven and low manufacturing cost, and no color mixing and color shifting between subpixels adjacent to each other, without leading to a great increase in size of a manufacturing apparatus and a decrease in efficiency of utilization of a vapor-deposition material can be produced.

Advantageous Effects of Invention

According to an aspect of the disclosure, an organic EL display device with higher resolution, suppressed power consumption while being driven and low manufacturing cost, and no color mixing and color shifting between subpixels adjacent to each other, and an organic EL display device manufacturing method can be provided. The organic EL display device manufacturing method is capable of producing an organic EL display device with higher resolution, suppressed power consumption while being driven and low manufacturing cost, and no color mixing and color shifting between subpixels adjacent to each other, without leading to a great increase in size of a manufacturing apparatus and a decrease in efficiency of utilization of a vapor-deposition material.

DESCRIPTION OF EMBODIMENTS

Figure 1:
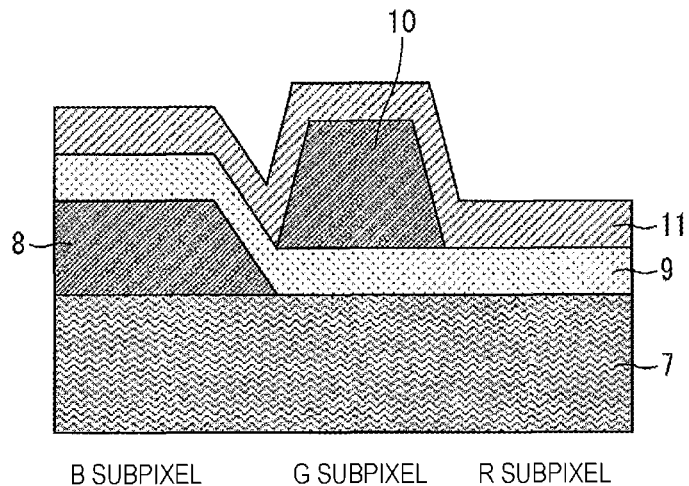
FIG. 1 is a view illustrating a schematic configuration of a B subpixel, a G subpixel, and an R subpixel in a light-emitting layer formed between a positive electrode and a negative electrode included in an organic EL display device according to a first embodiment of the disclosure.

Embodiments of the disclosure will now be described herein with reference to FIGS. 1 to 19. Hereinafter, for convenience of descriptions, a configuration having the same functions as those of a configuration described in a specific embodiment are denoted by the same reference numerals, and its descriptions may be omitted.

First Embodiment

A first embodiment of the disclosure will be described with reference to FIGS. 1 to 9.

Figure 2:
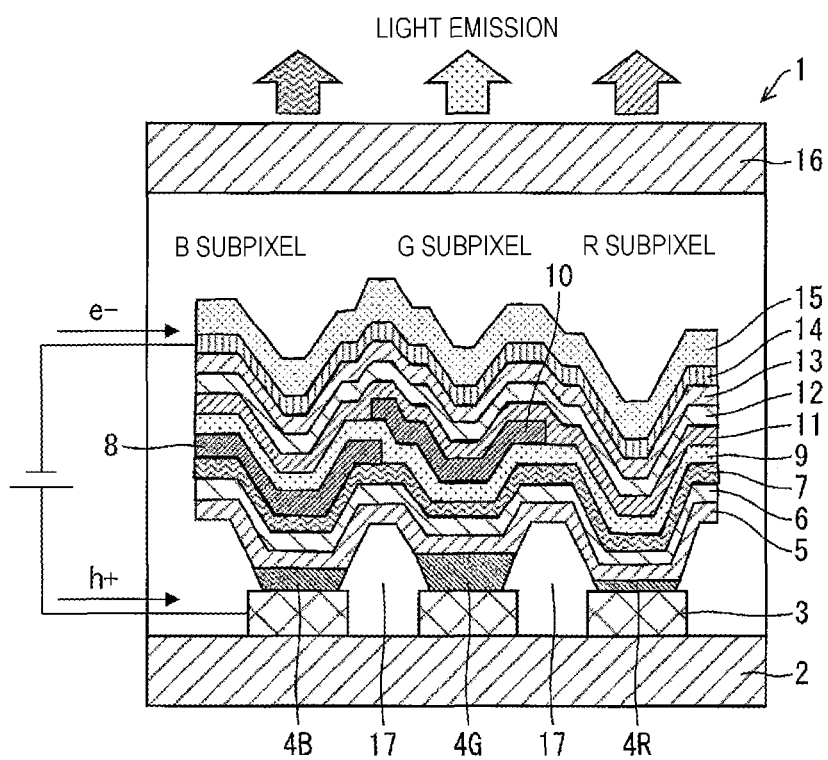
FIG. 2 is a view illustrating a schematic configuration of the organic EL display device according to the first embodiment of the disclosure.

FIG. 1 is a view illustrating a schematic configuration of a B subpixel, a G subpixel, and an R subpixel in a light-emitting layer formed between a positive electrode and a negative electrode included in an organic EL display device 1 illustrated in FIG. 2.

As illustrated, the light-emitting layer included in the organic EL display device 1 includes a common blue-light-emitting layer (second fluorescence light-emitting layer) 7, a common green-light-emitting layer (third fluorescence light-emitting layer) 9, a common red-light-emitting layer (first fluorescence light-emitting layer) 11, a first separation layer 8, and a second separation layer 10.

Each of the B subpixel, the G subpixel, and the R subpixel configuring one pixel has a layered structure as described below.

In the B subpixel, the common blue-light-emitting layer 7, the first separation layer 8, the common green-light-emitting layer 9, and the common red-light-emitting layer 11 are layered in order from below. The first separation layer 8 is present between the common blue-light-emitting layer 7 and the common green-light-emitting layer 9.

In the G subpixel, the common blue-light-emitting layer 7, the common green-light-emitting layer 9, the second separation layer 10, and the common red-light-emitting layer 11 are layered in order from below. The second separation layer 10 is present between the common green-light-emitting layer 9 and the common red-light-emitting layer 11.

In the R subpixel, the common blue-light-emitting layer 7, the common green-light-emitting layer 9, and the common red-light-emitting layer 11 are layered in order from below. Neither the first separation layer 8 nor the second separation layer 10 is present, different from the B subpixel and the G subpixel described above.

FIG. 2 is a view illustrating a schematic configuration of the organic EL display device 1.

In the embodiment, a glass substrate (also referred to as a thin film transistor (TFT) substrate) on which TFT elements (not illustrated) are formed is used as a substrate 2. For each of the subpixels, the following layers having respective film thicknesses are layered on the substrate 2 in the described order.

In the B subpixel, a blue-light-emitting organic EL element is provided. A reflective electrode 3: Ag (100 nm), a positive electrode 4B: ITO (100 nm), a hole injection layer 5: HAT-CN (10 nm), a hole transport layer 6: TAPC (20 nm), the common blue-light-emitting layer 7: ADN/TBPe (10%) (10 nm), the first separation layer 8: BCP (30 nm), the common green-light-emitting layer 9: BCP/Coumarin 6 (10%) (10 nm), the common red-light-emitting layer 11: BCP/DCM (10%) (10 nm), an electron transport layer 12: BCP (30 nm), an electron injection layer 13: LiF (1 nm), a negative electrode 14: Ag/Mg alloy (Ag/Mg combination ratio=0.9:0.1) (20 nm), and a protection layer 15: ITO (80 nm) are layered to form the blue-light-emitting organic EL element.

In the G subpixel, a green-light-emitting organic EL element is provided. The reflective electrode 3: Ag (100 nm), a positive electrode 4G: ITO (140 nm), the hole injection layer 5: HAT-CN (10 nm), the hole transport layer 6: TAPC (20 nm), the common blue-light-emitting layer 7: ADN/TBPe (10%) (10 nm), the common green-light-emitting layer 9: BCP/Coumarin 6 (10%) (10 nm), the second separation layer 10: BCP (30 nm), the common red-light-emitting layer 11: BCP/DCM (10%) (10 nm), the electron transport layer 12: BCP (30 nm), the electron injection layer 13: LiF (1 nm), the negative electrode 14: Ag/Mg alloy (Ag/Mg combination ratio=0.9:0.1) (20 nm), and the protection layer 15: ITO (80 nm) are layered to form the green-light-emitting organic EL element.

In the R subpixel, a red-light-emitting organic EL element is provided. The reflective electrode 3: Ag (100 nm), a positive electrode 4R: ITO (40 nm), the hole injection layer 5: HAT-CN (10 nm), the hole transport layer 6: TAPC (20 nm), the common blue-light-emitting layer 7: ADN/TBPe (10%) (10 nm), the common green-light-emitting layer 9: BCP/Coumarin 6 (10%) (10 nm), the common red-light-emitting layer 11: BCP/DCM (10%) (10 nm), the electron transport layer 12: BCP (30 nm), the electron injection layer 13: LiF (1 nm), the negative electrode 14: Ag/Mg alloy (Ag/Mg combination ratio=0.9:0.1) (20 nm), and the protection layer 15: ITO (80 nm) are layered to form the red-light-emitting organic EL element.

The hole injection layer 5, the hole transport layer 6, the common blue-light-emitting layer 7, the common green-light-emitting layer 9, the common red-light-emitting layer 11, the electron transport layer 12, the electron injection layer 13, the negative electrode 14, and the protection layer 15 are each formed as a single common layer in a plurality of pixels, and accordingly are formed over the B subpixel, the G subpixel, and the R subpixel configuring the one pixel.

On the substrate 2, the reflective electrodes 3 are each separately formed at a constant film thickness per subpixel, and are each coupled to a drain electrode of the TFT element included per subpixel. On the reflective electrode 3 of a B subpixel, the positive electrode 4B is formed at a film thickness of 100 nm. On the reflective electrode 3 of a G subpixel, the positive electrode 4G is formed at a film thickness of 140 nm. On the reflective electrode 3 of an R subpixel, the positive electrode 4R is formed at a film thickness of 40 nm. The reason of why the film thickness of the positive electrode differs per subpixel is that, in the B sub pixel, an optical distance between the reflective electrode 3 and the common blue-light-emitting layer 7 is set to a distance allowing blue light to be extracted at highest intensity, in the G subpixel, an optical distance between the reflective electrode 3 and the common green-light-emitting layer 9 is set to a distance allowing green light to be extracted at highest intensity, and, in the R subpixel, an optical distance between the reflective electrode 3 and the common red-light-emitting layer 11 is set to a distance allowing red light to be extracted at highest intensity, and the optical distances are adjusted with the film thicknesses of the positive electrodes.

In the embodiment, to prevent the organic EL elements from being degraded due to moisture and oxygen in air, the protection layer 15 is provided. Further, the organic EL elements are sealed by a substrate 16 and the substrate 2 that are bonded together with an adhesive, for example. However, the disclosure is not limited to the embodiment.

The organic EL display device 1 can achieve a desired display by allowing a current to flow from a drive circuit (not illustrated), via the TFT element included per subpixel, to the organic EL element of each of the subpixels to emit light.

In the organic EL display device 1, the positive electrodes 4B, 4G, and 4R are each provided with the reflective electrode 3 as a reflective layer, while the negative electrode 14 is a translucent electrode. Therefore, the organic EL display device 1 is a top-emitting-type organic EL display device.

The reflective electrodes 3 and the positive electrodes 4B, 4G, and 4R are patterned into predetermined shapes determining light emitting regions. Each of a space between a pair of the reflective electrode 3 and the positive electrode 4B and a pair of the reflective electrode 3 and the positive electrode 4G and a space between a pair of the reflective electrode 3 and the positive electrode 4G and a pair of the reflective electrode 3 and the positive electrode 4R is filled with a resin layer 17, and the resin layer 17 further protrudes outward from the spaces.

In the organic EL display device 1, the organic EL elements in the subpixels are each formed by taking into account a Förster radius between the common blue-light-emitting layer 7 and the common green-light-emitting layer 9, determined based on a degree of overlapping between a photoluminescence light-emitting spectrum of a blue fluorescence light-emitting material contained in the common blue-light-emitting layer 7 and an absorption spectrum of a green fluorescence light-emitting material contained in the common green-light-emitting layer 9, and a Förster radius between the common green-light-emitting layer 9 and the common red-light-emitting layer 11, determined based on a degree of overlapping between a photoluminescence light-emitting spectrum of the green fluorescence light-emitting material contained in the common green-light-emitting layer 9 and an absorption spectrum of a red fluorescence light-emitting material contained in the common red-light-emitting layer 11.

The Förster radius denotes a distance between light-emitting layers adjacent to each other with higher likelihood of an occurrence of Förster transition (specifically, a distance between most adjacent surfaces of light-emitting layers adjacent to each other). For example, under a greater degree of overlapping between the photoluminescence light-emitting spectrum of the blue fluorescence light-emitting material contained in the common blue-light-emitting layer 7 and the absorption spectrum of the green fluorescence light-emitting material contained in the common green-light-emitting layer 9, the Förster radius increases. Under a smaller degree of overlapping, the Förster radius reduces. The Förster radius ranges from approximately 1 nm to approximately 10 nm in general.

The Förster transition denotes energy transfer between light-emitting layers adjacent to each other, causing singlet excitons at a higher energy level to excite molecules in a singlet ground state at a lower energy level.

The Förster transition always occurs as long as light-emitting layers adjacent to each other are present within the Förster radius, which eliminates the need for causing the light-emitting layers adjacent to each other to be in direct contact with each other. When three or more light-emitting layers adjacent to each other are all present within the Förster radius, the Förster transition occurs a plurality of times in a stepwise manner between the three or more light-emitting layers adjacent to each other, allowing singlet excitons at the higher energy level to excite molecules in the singlet ground state at the lower energy level.

As described above, the Förster radius ranges from approximately 1 nm to approximately 10 nm in general. When a distance between light-emitting layers adjacent to each other is greater than 10 nm, no Förster transition occurs. The distance between the light-emitting layers adjacent to each other is preferably 15 nm or greater. With the distance, no Förster transition occurs between the light-emitting layers adjacent to each other even when a photoluminescence light-emitting spectrum and an absorption spectrum of the light-emitting layers adjacent to each other fully overlap.

The common blue-light-emitting layer 7 contains ADN (90%) as a host material and TBPe (10%) as the blue fluorescence light-emitting material (blue fluorescence dopant). The common green-light-emitting layer 9 contains BCP (90%) as a host material and Coumarin 6 (10%) as the green fluorescence light-emitting material (green fluorescence dopant). The common red-light-emitting layer 11 contains BCP (90%) as a host material and DCM (10%) as the red fluorescence light-emitting material (red fluorescence dopant).

Figure 3:
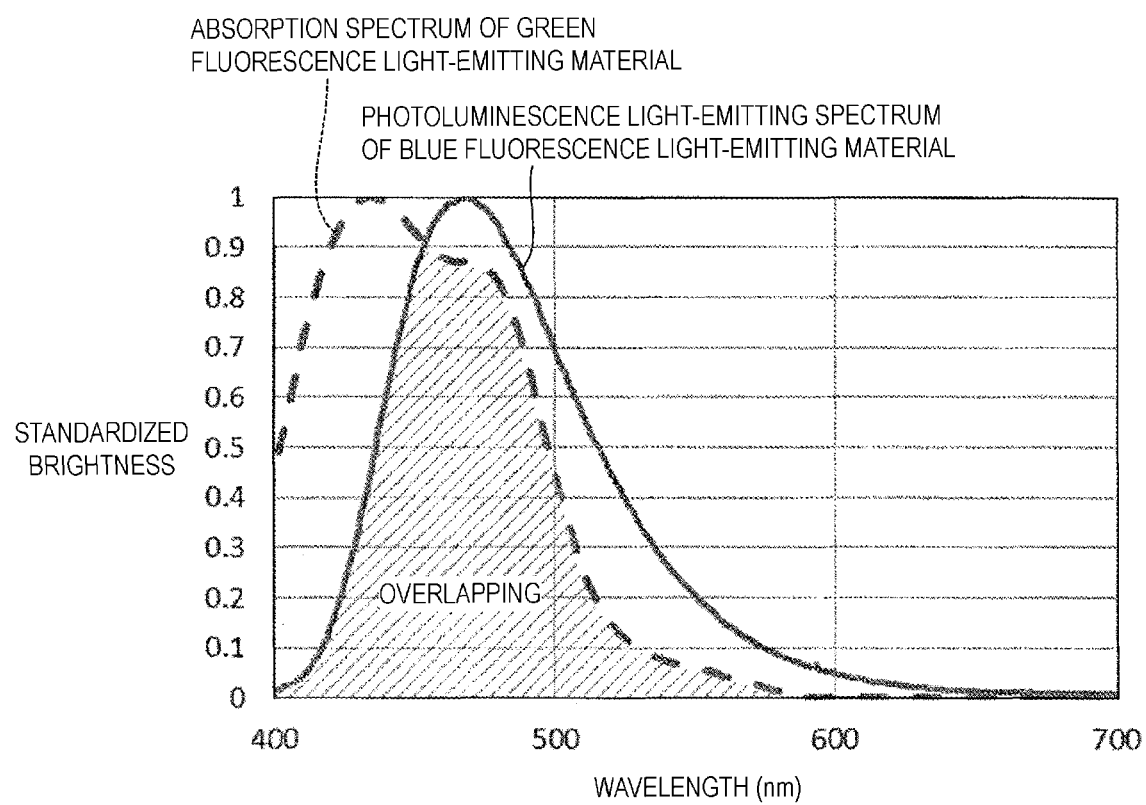
FIG. 3 is a diagram illustrating a degree of overlapping between an absorption spectrum of a green fluorescence light-emitting material (green fluorescence dopant) contained in a common green-light-emitting layer and a photoluminescence light-emitting spectrum of a blue fluorescence light-emitting material (blue fluorescence dopant) contained in a common blue-light-emitting layer.

FIG. 3 is a schematic diagram illustrating a degree of overlapping between an absorption spectrum of Coumarin 6 used as the green fluorescence light-emitting material (green fluorescence dopant) contained in the common green-light-emitting layer 9 and a photoluminescence light-emitting spectrum of TBPe used as the blue fluorescence light-emitting material (blue fluorescence dopant) contained in the common blue-light-emitting layer 7.

Figure 4:
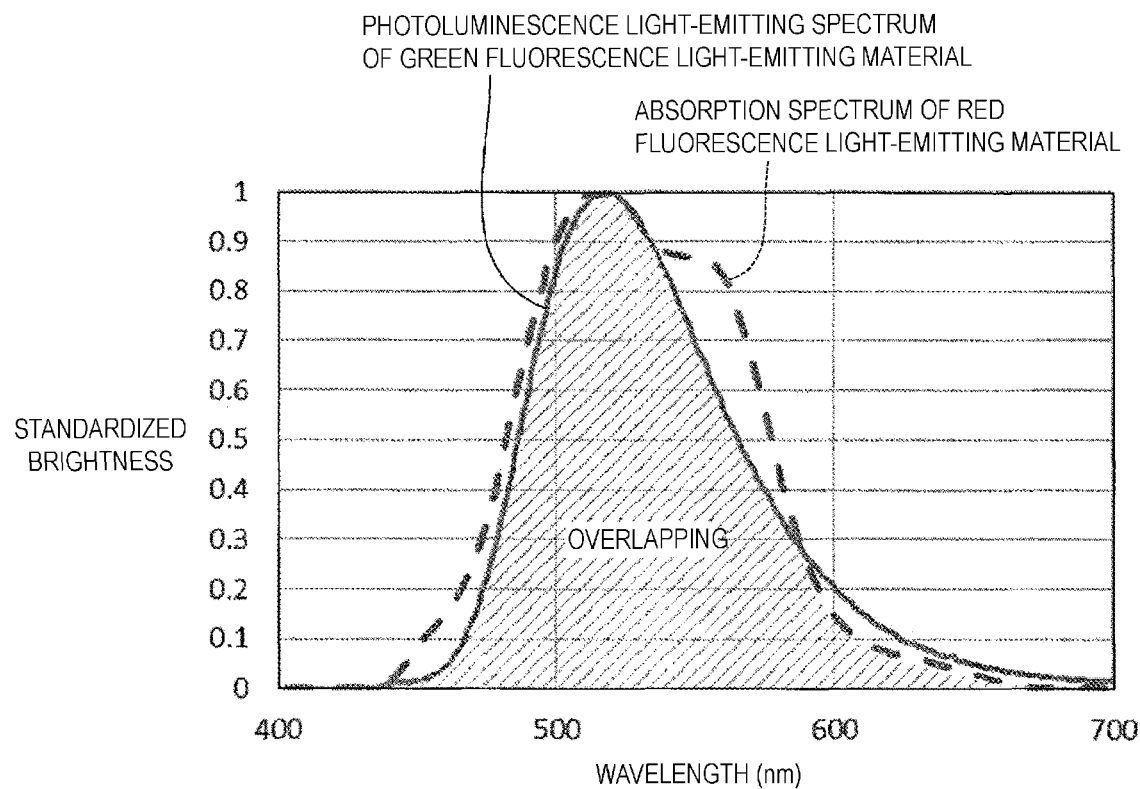
FIG. 4 is a diagram illustrating a degree of overlapping between a photoluminescence light-emitting spectrum of the green fluorescence light-emitting material (green fluorescence dopant) contained in the common green-light-emitting layer and an absorption spectrum of a red fluorescence light-emitting material (red fluorescence dopant) contained in a common red-light-emitting layer.

FIG. 4 is a schematic diagram illustrating a degree of overlapping between a photoluminescence light-emitting spectrum of Coumarin 6 used as the green fluorescence light-emitting material (green fluorescence dopant) contained in the common green-light-emitting layer 9 and an absorption spectrum of DCM used as the red fluorescence light-emitting material (red fluorescence dopant) contained in the common red-light-emitting layer 11.

Figure 5:
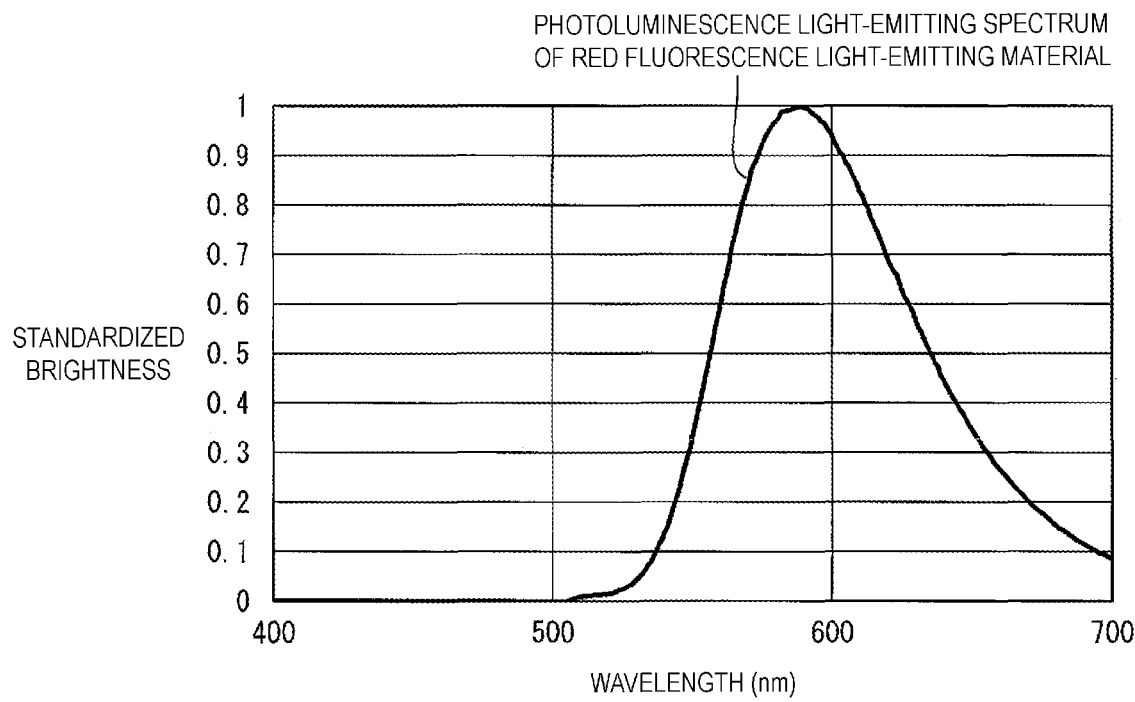
FIG. 5 is a diagram illustrating a photoluminescence light-emitting spectrum of the red fluorescence light-emitting material (red fluorescence dopant) contained in the common red-light-emitting layer.

FIG. 5 is a schematic diagram illustrating a photoluminescence light-emitting spectrum of DCM used as the red fluorescence light-emitting material (red fluorescence dopant) contained in the common red-light-emitting layer 11.

As illustrated in FIG. 3, a peak wavelength of the blue fluorescence light-emitting material (blue fluorescence dopant) contained in the common blue-light-emitting layer 7 is approximately 480 nm. As illustrated in FIG. 4, a peak wavelength of the green fluorescence light-emitting material (green fluorescence dopant) contained in the common green-light-emitting layer 9 is approximately 530 nm. As illustrated in FIG. 5, a peak wavelength of the red fluorescence light-emitting material (red fluorescence dopant) contained in the common red-light-emitting layer 11 is approximately 580 nm.

As illustrated in FIGS. 3 and 4, in both the cases, the degrees of overlapping are relatively greater. When the common blue-light-emitting layer 7 and the common green-light-emitting layer 9 are arranged within the Förster radius, the Förster transition occurs. When the common blue-light-emitting layer 7 and the common green-light-emitting layer 9 are arranged farther away from each other than the Förster radius, no Förster transition occurs. Similarly, when the common green-light-emitting layer 9 and the common red-light-emitting layer 11 are arranged within the Förster radius, the Förster transition occurs. When the common green-light-emitting layer 9 and the common red-light-emitting layer 11 are arranged farther away from each other than the Förster radius, no Förster transition occurs.

In the embodiment, when it is required that a distance between light-emitting layers adjacent to each other be greater than the Förster radius, the distance between the light-emitting layers adjacent to each other is set to 15 nm or greater, based on a fact that a distance preventing the Förster transition from occurring between light-emitting layers adjacent to each other even when a photoluminescence light-emitting spectrum and an absorption spectrum of the light-emitting layers adjacent to each other fully overlap is 15 nm or greater.

Specifically, the first separation layer 8 determining a distance between the common blue-light-emitting layer 7 and the common green-light-emitting layer 9 is formed at a film thickness of 30 nm, while the second separation layer 10 determining a distance between the common green-light-emitting layer 9 and the common red-light-emitting layer 11 is formed at a film thickness of 30 nm.

In the embodiment, the first separation layer 8 and the second separation layer 10 are each formed at a film thickness of 30 nm. However, the disclosure is not limited to the embodiment. The first separation layer 8 and the second separation layer 10 may each be formed at a film thickness ranging from 15 nm to 50 nm, both inclusive. Further, the first separation layer 8 and the second separation layer 10 each are preferably formed at a film thickness ranging from 15 nm to 30 nm, both inclusive.

Figure 6A:
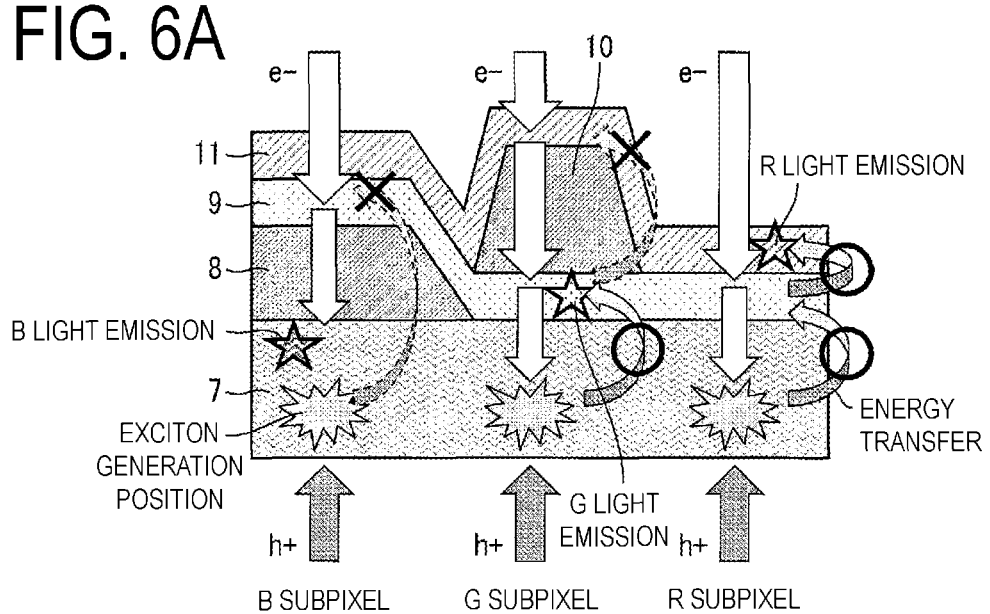
FIGS. 6A and 6B are views for describing a light emission mechanism, through Förster transition, of the organic EL display device according to the first embodiment of the disclosure.
Figure 6B:
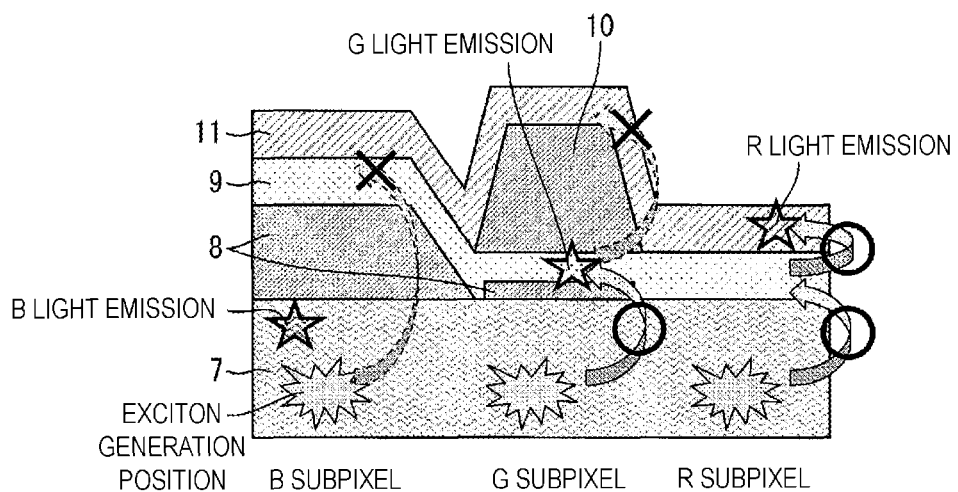

FIGS. 6A and 6B are diagrams for describing a light emission mechanism, through the Förster transition, of the organic EL display device 1.

As illustrated in FIG. 6A, in the organic EL display device 1, the common blue-light-emitting layer 7 is designed as an exciton generation layer. Therefore, the common blue-light-emitting layer 7 generates singlet excitons.

In the B subpixel, the first separation layer 8 is formed at a film thickness of 30 nm between the common blue-light-emitting layer 7 and the common green-light-emitting layer 9. The distance between the common blue-light-emitting layer 7 and the common green-light-emitting layer 9 is greater than the Förster radius.

As a result, in the B subpixel, no Förster transition occurs between the common blue-light-emitting layer 7 and the common green-light-emitting layer 9. When the singlet excitons generated in the common blue-light-emitting layer 7 reach the ground state, B light emission (emission of light within a blue wavelength range) occurs. In the B subpixel, only B light emission is achieved.

In the G subpixel, the second separation layer 10 is formed at a film thickness of 30 nm between the common green-light-emitting layer 9 and the common red-light-emitting layer 11. The distance between the common blue-light-emitting layer 7 and the common green-light-emitting layer 9 is smaller than the Förster radius. The distance between the common green-light-emitting layer 9 and the common red-light-emitting layer 11 is greater than the Förster radius.

As a result, in the G subpixel, the Förster transition occurs between the common blue-light-emitting layer 7 and the common green-light-emitting layer 9, while no Förster transition occurs between the common green-light-emitting layer 9 and the common red-light-emitting layer 11. Energy transfer occurs from the singlet excitons generated in the common blue-light-emitting layer 7 to singlet excitons in the common green-light-emitting layer 9. When the singlet excitons in the common green-light-emitting layer 9 reach the ground state, G light emission (emission of light within a green wavelength range) occurs. In the G subpixel, only G light emission is achieved.

In the R subpixel, neither the first separation layer 8 nor the second separation layer 10 is provided. The common blue-light-emitting layer 7, the common green-light-emitting layer 9, and the common red-light-emitting layer 11 are provided in contact with each other.

As a result, in the R subpixel, the Förster transition occurs between the common blue-light-emitting layer 7 and the common green-light-emitting layer 9, and between the common green-light-emitting layer 9 and the common red-light-emitting layer 11.

The singlet excitons generated in the common blue-light-emitting layer 7 generate excitons from the singlet ground state in the common green-light-emitting layer 9 through energy transfer. The singlet excitons in the common green-light-emitting layer 9 generate excitons from the singlet ground state in the common red-light-emitting layer 11 through energy transfer. When the singlet excitons in the common red-light-emitting layer 11 reach the ground state, R light emission (emission of light within a red wavelength range) occurs. In the R subpixel, only R light emission is achieved.

In the embodiment, to allow the Förster transition to further efficiently occur between light-emitting layers formed in contact with each other, that is, to arrange the light-emitting layers fully within the Förster radius, the common blue-light-emitting layer 7, the common green-light-emitting layer 9, and the common red-light-emitting layer 11 are all formed at a film thickness of 10 nm. However, as long as the Förster transition occurs between light-emitting layers adjacent to each other, the disclosure is not limited to the embodiment.

In the embodiment, the common blue-light-emitting layer 7 is designed as the exciton generation layer. It is required that holes ($h^+$) injected from the reflective electrodes 3 and the positive electrodes 4B, 4G, and 4R and electrons ($e^-$) injected from the negative electrode 14 meet in the common blue-light-emitting layer 7.

In the organic EL display device 1, the common blue-light-emitting layer 7 is arranged closer to the reflective electrodes 3 and the positive electrodes 4B, 4G, and 4R than to the negative electrode 14. Electron mobility of a material (host material) with a combination ratio exceeding 50% in each of the first separation layer 8, the common green-light-emitting layer 9, the second separation layer 10, and the common red-light-emitting layer 11 formed on the common blue-light-emitting layer 7 may be greater than hole mobility.

To achieve this, the same BCP used for the electron transport layer 12 is used for the first separation layer 8, the host material of the common green-light-emitting layer 9, and the second separation layer 10, and the BCP is also used for the host material of the common red-light-emitting layer 11.

As described above, in the organic EL display device 1, the common blue-light-emitting layer 7 can be served as the exciton generation layer.

As illustrated, the common blue-light-emitting layer 7, the common green-light-emitting layer 9, and the common red-light-emitting layer 11 are each formed as a single common layer in the plurality of pixels (each including the B subpixel, the G subpixel, and the R subpixel), and are fully vapor-deposited with an open mask, for example, instead of separately patterning vapor deposition.

It is required that the first separation layer 8 be formed in the B subpixel only, while the second separation layer 10 be formed in the G subpixel only. Therefore, the first separation layer 8 and the second separation layer 10 are formed through separately patterning vapor deposition.

As described above, the organic EL display device 1 with a full-color display feature can be achieved by performing separately patterning vapor deposition twice only for the first separation layer 8 and the second separation layer 10. Compared with a known structure formed through separately patterning vapor deposition three times for a red-light-emitting layer, a green-light-emitting layer, and a blue-light-emitting layer, a number of times of performing separately patterning vapor deposition can be reduced, achieving cost reduction through a simplified process.

In the organic EL display device 1, as described above, the first separation layer 8 and the second separation layer 10 do not contain a light-emitting material (fluorescence dopant or phosphorescence dopant). Therefore, even when a vapor deposition material enters into one of subpixels adjacent to each other, color mixing between the subpixels adjacent to each other does not occur.

FIG. 6B is a diagram for describing a reason why, even when a vapor deposition material enters into one of subpixels adjacent to each other, color mixing between the subpixels adjacent to each other does not occur in the organic EL display device 1.

As illustrated, even when the first separation layer 8 enters into not only the B subpixel, but also the G subpixel through separately patterning vapor deposition, the first separation layer 8 formed in the G subpixel is a thin layer having a film thickness equal to or below the Förster radius. In the G subpixel, even when such a thin layer having a film thickness described above is present, the Förster transition still occurs between the common blue-light-emitting layer 7 and the common green-light-emitting layer 9. The reason is that the Förster transition occurs as long as the common blue-light-emitting layer 7 and the common green-light-emitting layer 9 lie within the Förster radius, even when the common blue-light-emitting layer 7 and the common green-light-emitting layer 9 are not in direct contact with each other.

As a result, even when either of the first separation layer 8 and the second separation layer 10 without containing a light-emitting material (fluorescence dopant or phosphorescence dopant) enters into an adjacent subpixel through separately patterning vapor deposition, as long as an amount of the entry is minute, the organic EL display device 1 is not negatively affected for its display characteristics. The feature increases a process margin.

Figure 7:
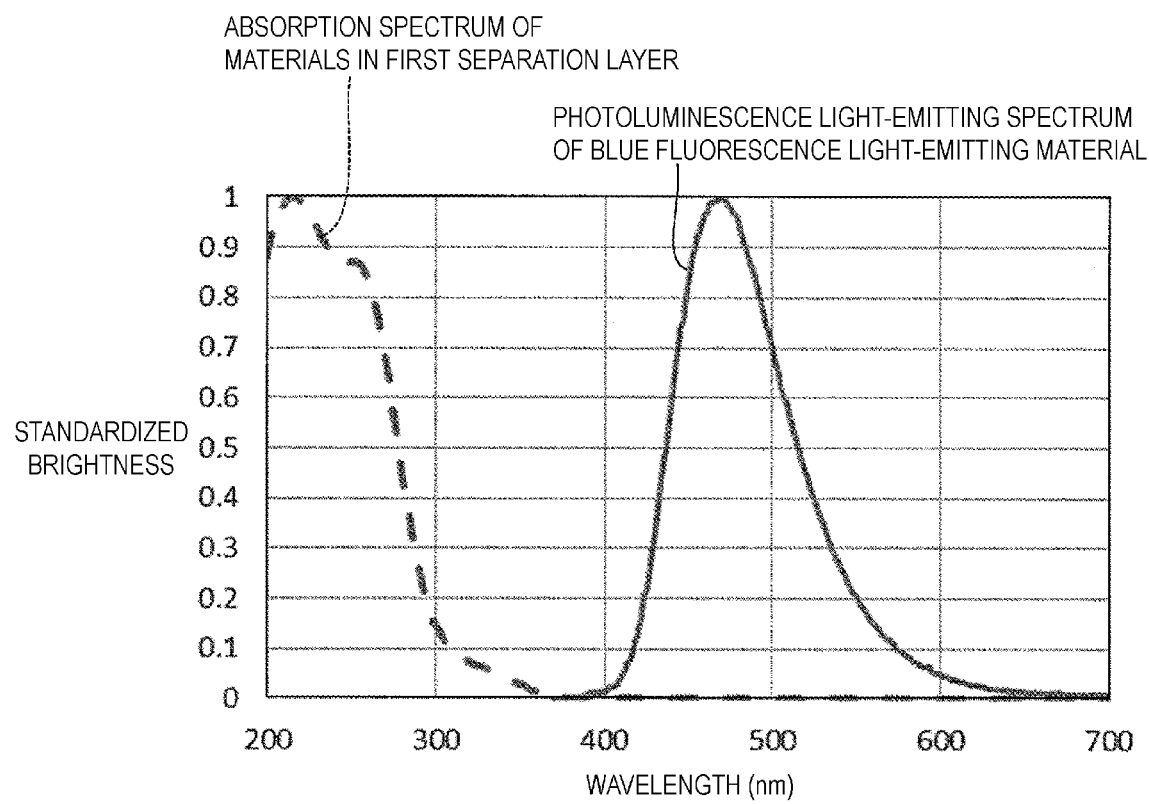
FIG. 7 is a diagram illustrating a degree of overlapping between an absorption spectrum of a material in a first separation layer and the photoluminescence light-emitting spectrum of the blue fluorescence light-emitting material (blue fluorescence dopant) contained in the common blue-light-emitting layer.

FIG. 7 is a schematic diagram illustrating a degree of overlapping between an absorption spectrum of a material, i.e., BCP, in the first separation layer 8 and the photoluminescence light-emitting spectrum of the blue fluorescence light-emitting material (blue fluorescence dopant), i.e., TBPe, contained in the common blue-light-emitting layer 7.

In the B subpixel, the first separation layer 8 is arranged on the common blue-light-emitting layer 7. In terms of light-emitting efficiency of blue light, the photoluminescence light-emitting spectrum of the blue fluorescence light-emitting material (blue fluorescence dopant), i.e., TBPe, contained in the common blue-light-emitting layer 7 and the absorption spectrum of the material, i.e., BCP, in the first separation layer 8 preferably do not overlap with each other.

As illustrated, the material, i.e., BCP, in the first separation layer 8 does not have a light-emitting spectrum in a visible region. The absorption spectrum is further shorter in wavelength within an ultraviolet region. As a result, the absorption spectrum does not overlap with the photoluminescence light-emitting spectrum of the blue fluorescence light-emitting material (blue fluorescence dopant), i.e., TBPe, contained in the common blue-light-emitting layer 7.

Figure 8:
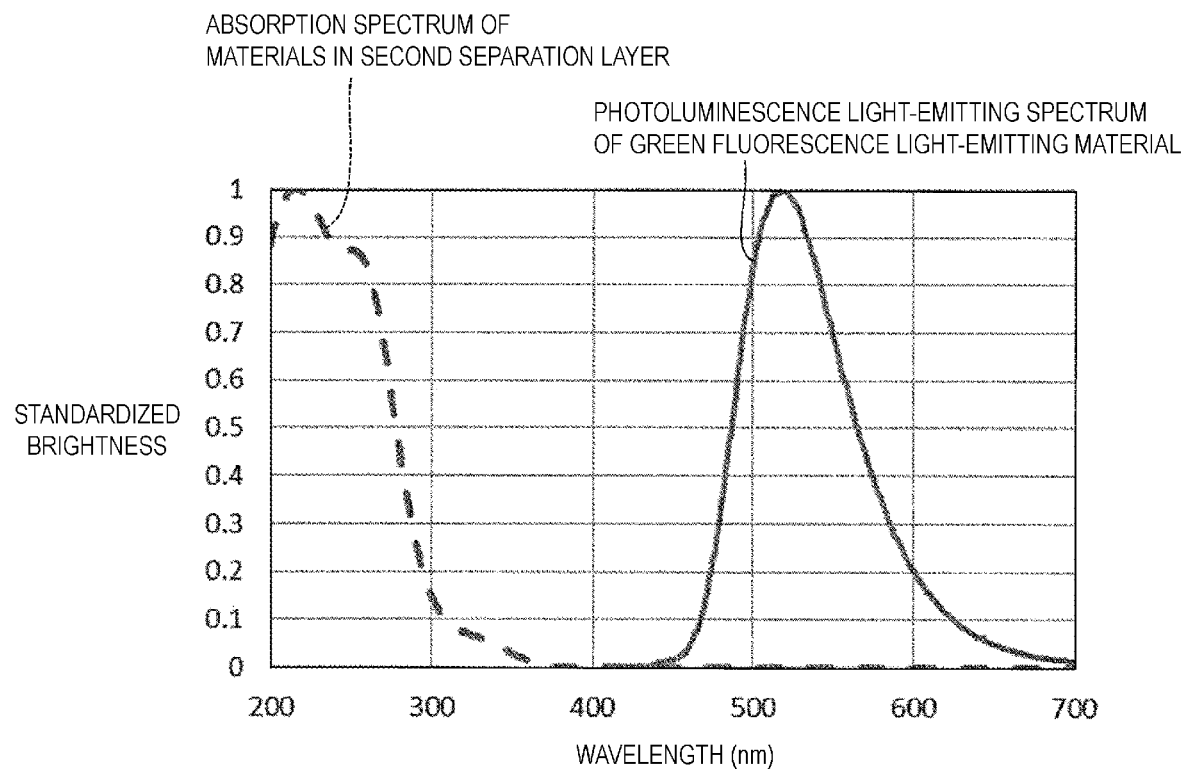
FIG. 8 is a diagram illustrating a degree of overlapping between an absorption spectrum of a material in a second separation layer and the photoluminescence light-emitting spectrum of the green fluorescence light-emitting material (green fluorescence dopant) contained in the common green-light-emitting layer.

FIG. 8 is a schematic diagram illustrating a degree of overlapping between an absorption spectrum of a material, i.e., BCP, in the second separation layer 10 and the photoluminescence light-emitting spectrum of the green fluorescence light-emitting material (green fluorescence dopant), i.e., Coumarin 6, contained in the common green-light-emitting layer 9.

In the G subpixel, the second separation layer 10 is arranged on the common green-light-emitting layer 9. In terms of light-emitting efficiency of green light, the photoluminescence light-emitting spectrum of the green fluorescence light-emitting material (green fluorescence dopant), i.e., Coumarin 6, contained in the common green-light-emitting layer 9 and the absorption spectrum of the material, i.e., BCP, in the second separation layer 10 preferably do not overlap with each other.

As illustrated, the material, i.e., BCP, in the second separation layer 8 does not have a light-emitting spectrum in the visible region. The absorption spectrum is further shorter in wavelength within the ultraviolet region. As a result, the absorption spectrum does not overlap with the photoluminescence light-emitting spectrum of the green fluorescence light-emitting material (green fluorescence dopant), i.e., Coumarin 6, contained in the common green-light-emitting layer 9.

The organic EL display device 1 can achieve B light emission, G light emission, and R light emission respectively in the B subpixel, the G subpixel, and the R subpixel through the Förster transition without causing the common blue-light-emitting layer 7, the common green-light-emitting layer 9, and the common red-light-emitting layer 11 to wholly emit light simultaneously, suppressing power consumption while being driven.

The organic EL display device 1 can achieve B light emission, G light emission, and R light emission respectively in the B subpixel, the G subpixel, and the R subpixel through the Förster transition without requiring a separate color filter, suppressing manufacturing cost.

As described above, according to the configuration, the organic EL display device 1 with higher resolution, suppressed power consumption while being driven and low manufacturing cost, and no color mixing and color shifting between subpixels adjacent to each other can be achieved.

In the embodiment, an example of achieving B light emission, G light emission, and R light emission in the B subpixel, the G subpixel, and the R subpixel has been described. However, the disclosure is not limited to the embodiment. A first subpixel, a second subpixel, and a third subpixel in each of a plurality of pixels in an organic EL display device may emit light with peak wavelengths different from each other.

With the organic EL display device 1, the common blue-light-emitting layer 7, the common green-light-emitting layer 9, and the common red-light-emitting layer 11 are each formed as a single common layer in the plurality of pixels. The common blue-light-emitting layer 7, the common green-light-emitting layer 9, and the common red-light-emitting layer 11 are not formed through separately patterning vapor deposition.

In separately patterning vapor deposition, vapor deposition films are formed through vapor deposition performed a plurality of times in a shape corresponding to each of the subpixels.

The first separation layer 8 provided in the B subpixel and the second separation layer 10 provided in the G subpixel do not contain a light-emitting material. Therefore, even when a vapor deposition material enters into one of subpixels adjacent to each other, color mixing between the subpixels adjacent to each other does not occur.

As a result, according to the configuration, even when a light-emitting layer is formed through separately patterning vapor deposition, and even when a vapor deposition material enters into one of subpixels adjacent to each other, color mixing between the subpixels adjacent to each other does not occur.

With the organic EL display device 1, the B subpixel, the G subpixel, and the R subpixel emit light with peak wavelengths different from each other through energy transfer between singlet levels in fluorescence light-emitting layers adjacent to each other present within the Förster radius, i.e., the Förster transition, without causing the common blue-light-emitting layer 7, the common green-light-emitting layer 9, and the common red-light-emitting layer 11 to wholly emit light simultaneously, suppressing power consumption while being driven.

With the organic EL display device 1, the B subpixel, the G subpixel, and the R subpixel emit light with peak wavelengths different from each other through the Förster transition without requiring a separate color filter, suppressing manufacturing cost.

With the organic EL display device 1, the B subpixel, the G subpixel, and the R subpixel emit light with peak wavelengths different from each other through the Förster transition. Even when the first separation layer 8 is formed in a thin film in a subpixel adjacent to the B subpixel and the second separation layer 10 is formed in a thin film in a subpixel adjacent to the G subpixel, the B subpixel, the G subpixel, and the R subpixel can emit light with peak wavelengths different from each other. The reason is that the Förster transition occurs as long as the common blue-light-emitting layer 7, the common green-light-emitting layer 9, and the common red-light-emitting layer 11 lie within the Förster radius, even when the common blue-light-emitting layer 7, the common green-light-emitting layer 9, and the common red-light-emitting layer 11 are not in direct contact with each other.

With the organic EL display device 1, the B subpixel, the G subpixel, and the R subpixel emit light with peak wavelengths different from each other through the Förster transition. As a result, color mixing and color shifting between subpixels adjacent to each other due to light to be emitted obliquely do not occur.

As described above, according to the configuration, the organic EL display device 1 with higher resolution, suppressed power consumption while being driven and low manufacturing cost, and no color mixing and color shifting between subpixels adjacent to each other can be achieved.

Modification

Figure 9:
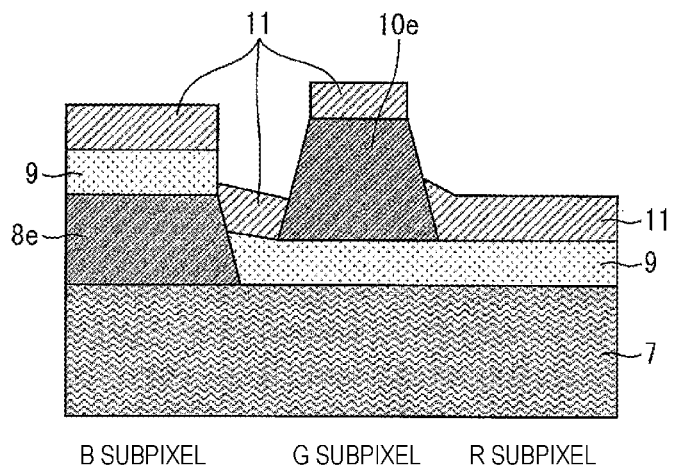
FIG. 9 is a view illustrating a modification of the organic EL display device according to the first embodiment of the disclosure.

FIG. 9 is a diagram illustrating a modification of the organic EL display device 1.

As illustrated in FIG. 1, the first separation layer 8 and the second separation layer 10 included in the organic EL display device 1, described above, are gently tapered. Therefore, the common green-light-emitting layer 9 formed on the first separation layer 8 and the common blue-light-emitting layer 7, and the common red-light-emitting layer 11 formed on the second separation layer 10 and the common green-light-emitting layer 9 are formed into films continuously.

On the other hand, in the modification of the organic EL display device 1 illustrated in FIG. 9, a first separation layer 8e and a second separation layer 10e are steeply tapered. The common green-light-emitting layer 9 formed on the first separation layer 8e and the common blue-light-emitting layer 7, and the common red-light-emitting layer 11 formed on the second separation layer 10e and the common green-light-emitting layer 9 are formed into films intermittently.

The common green-light-emitting layer 9 and the common red-light-emitting layer 11 formed into films intermittently, as illustrated in the modification of the organic EL display device 1 in FIG. 9, do not negatively affect the organic EL display device in terms of its display characteristics. The reason is that, as illustrated in FIG. 2, the reflective electrodes 3 and the positive electrodes 4B, 4G, and 4R are patterned into predetermined shapes determining light emitting regions.

In the first embodiment described above, an example of the common blue-light-emitting layer 7, the common green-light-emitting layer 9, and the common red-light-emitting layer 11 arranged in order from the reflective electrodes 3 and the positive electrodes 4B, 4G, and 4R has been described. However, the disclosure is not limited to the embodiment. As long as the common red-light-emitting layer 11 is arranged above or below the common blue-light-emitting layer 7 and the common green-light-emitting layer 9, the B subpixel, the G subpixel, and the R subpixel can respectively achieve B light emission, G light emission, and R light emission through the Förster transition.

A case where the common red-light-emitting layer 11 is arranged below the common blue-light-emitting layer 7 and the common green-light-emitting layer 9, while the common blue-light-emitting layer 7 is arranged above the common green-light-emitting layer 9 will be described in a sixth embodiment. A case where the common red-light-emitting layer 11 is arranged above the common blue-light-emitting layer 7 and the common green-light-emitting layer 9, while the common blue-light-emitting layer 7 is arranged above the common green-light-emitting layer 9 will be described in a seventh embodiment. A case where the common red-light-emitting layer 11 is arranged below the common blue-light-emitting layer 7 and the common green-light-emitting layer 9, while the common green-light-emitting layer 9 is arranged above the common blue-light-emitting layer 7 will be described in an eighth embodiment.

On the other hand, when the common red-light-emitting layer 11 is arranged between the common blue-light-emitting layer 7 and the common green-light-emitting layer 9, the G subpixel cannot achieve G light emission through the Förster transition.

Figure 10A:
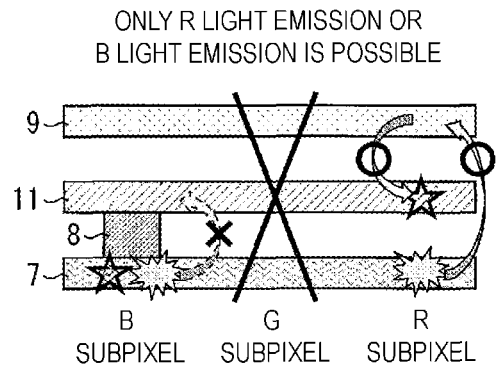
FIGS. 10A and 10B are diagrams for describing a reason of why the G subpixel cannot achieve G light emission through Förster transition when the common red-light-emitting layer is arranged between the common blue-light-emitting layer and the common green-light-emitting layer.
Figure 10B:
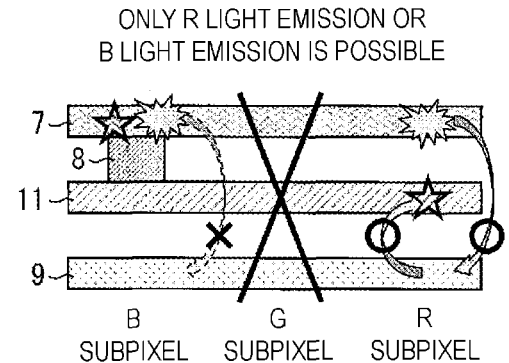
Figure 10B:
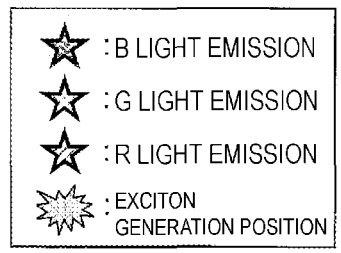

FIGS. 10A and 10B are diagrams for describing a reason of why the G subpixel cannot achieve G light emission through the Förster transition when the common red-light-emitting layer 11 is arranged between the common blue-light-emitting layer 7 and the common green-light-emitting layer 9.

As illustrated in FIG. 10A, when the common red-light-emitting layer 11 is arranged between the common blue-light-emitting layer 7 and the common green-light-emitting layer 9, and when the common green-light-emitting layer 9 is arranged above the common blue-light-emitting layer 7, the G subpixel cannot achieve G light emission even when a second separation layer is provided in the G subpixel at any position, or even when no second separation layer is provided in the G subpixel.

The reason is that, when a second separation layer is provided between the common blue-light-emitting layer 7 and the common red-light-emitting layer 11, B light emission is achieved. When a second separation layer is provided between the common red-light-emitting layer 11 and the common green-light-emitting layer 9, B light emission is also achieved (the photoluminescence light-emitting spectrum of the common blue-light-emitting layer 7 and the absorption spectrum of the common red-light-emitting layer 11 have almost no overlapped area). When no second separation layer is provided at all, R light emission is achieved, similar to the R subpixel.

As illustrated in FIG. 10B, when the common red-light-emitting layer 11 is arranged between the common blue-light-emitting layer 7 and the common green-light-emitting layer 9, and when the common blue-light-emitting layer 7 is arranged above the common green-light-emitting layer 9, the G subpixel cannot achieve G light emission even when a second separation layer is provided at any position in the G subpixel, or even when no second separation layer is provided at any position in the G subpixel.

When a second separation layer is provided between the common green-light-emitting layer 9 and the common red-light-emitting layer 11, B light emission is achieved (the photoluminescence light-emitting spectrum of the common blue-light-emitting layer 7 and the absorption spectrum of the common red-light-emitting layer 11 have almost no overlapped area). When a second separation layer is provided between the common red-light-emitting layer 11 and the common blue-light-emitting layer 7, B light emission is also achieved. When no second separation layer is provided at all, R light emission is achieved, similar to the R subpixel.

Second Embodiment

Next, a second embodiment of the disclosure will be described with reference to FIG. 11. The embodiment is similar or identical to the first embodiment described above, except that an organic EL display device 21 is a bottom-emitting type organic EL display device. For convenience of descriptions, members having the same functions as those of the members illustrated in the diagrams in the first embodiment are denoted by the same reference numerals, and descriptions thereof will be omitted.

Figure 11:
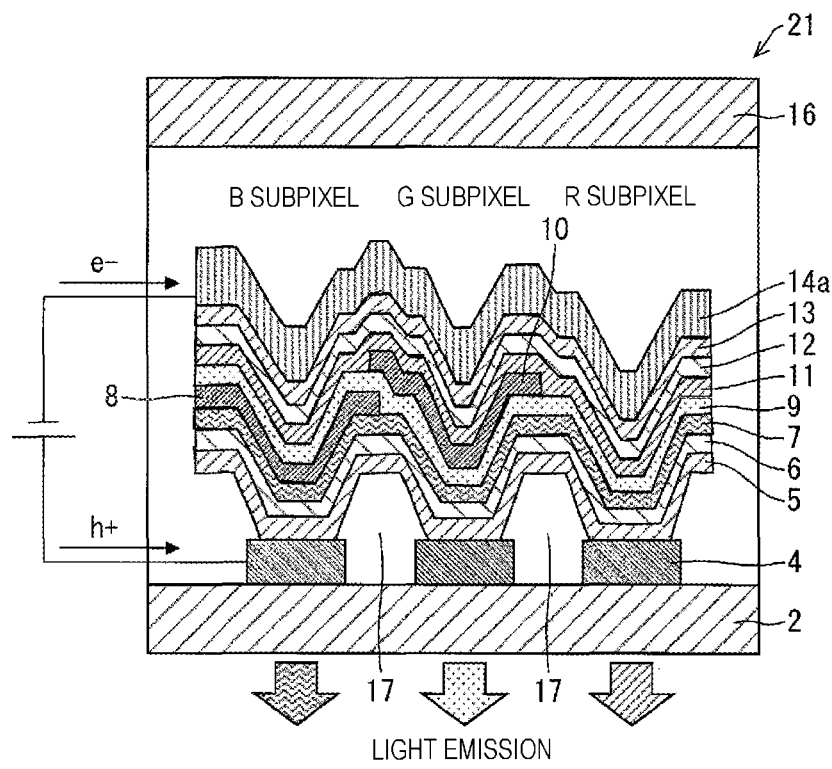
FIG. 11 is a view illustrating a schematic configuration of a bottom-emitting type organic EL display device according to a second embodiment of the disclosure.

FIG. 11 is a view illustrating a schematic configuration of the bottom-emitting type organic EL display device 21.

As illustrated, in the organic EL display device 21, a negative electrode 14a is made of Al (100 nm). The negative electrode 14a serves as a reflective electrode. The positive electrode 4 is made of ITO (100 nm), and is formed in each of the B subpixel, the G subpixel, and the R subpixel. The B subpixel, the G subpixel, and the R subpixel emit light toward the substrate 2.

According to the configuration, the bottom-emitting type organic EL display device 21 with higher resolution, suppressed power consumption while being driven and low manufacturing cost, and no color mixing and color shifting between subpixels adjacent to each other can be achieved.

Third Embodiment

Next, a third embodiment of the disclosure will be described with reference to FIGS. 12, 13A, and 13B. The embodiment is similar or identical to the first embodiment described above, except that a blue fluorescence light-emitting material (blue fluorescence dopant) contained in a common blue-light-emitting layer 7a included in an organic EL display device 31 is the TADF material (thermally activated delayed fluorescence material), and a green fluorescence light-emitting material (green fluorescence dopant) contained in a common green-light-emitting layer 9a is the TADF material (thermally activated delayed fluorescence material). For convenience of descriptions, members having the same functions as those of the members illustrated in the diagrams in the first embodiment are denoted by the same reference numerals, and descriptions thereof will be omitted.

Figure 12:
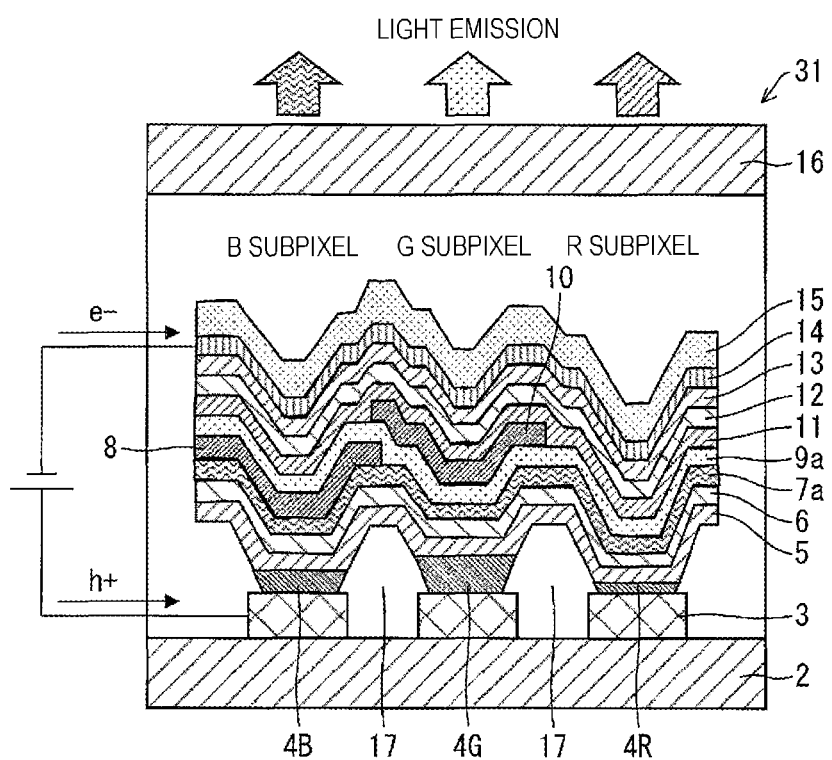
FIG. 12 is a view illustrating a schematic configuration of an organic EL display device according to a third embodiment of the disclosure.

FIG. 12 is a diagram illustrating a schematic configuration of the organic EL display device 31.

As illustrated, instead of the common blue-light-emitting layer 7 in the organic EL display device 1 illustrated in FIG. 2, the common blue-light-emitting layer 7a containing the TADF material (thermally activated delayed fluorescence material) serving as the blue fluorescence light-emitting material (blue fluorescence dopant) is used. Instead of the common green-light-emitting layer 9 in the organic EL display device 1 illustrated in FIG. 2, the common green-light-emitting layer 9a containing the TADF material (thermally activated delayed fluorescence material) serving as the green fluorescence light-emitting material (green fluorescence dopant) is used.

The common blue-light-emitting layer 7a contains DPEPO (90%) serving as a host material, and DMAC-DPS (10%) serving as the TADF material (thermally activated delayed fluorescence material) serving as the blue fluorescence light-emitting material (blue fluorescence dopant). The common blue-light-emitting layer 7a has a film thickness of 10 nm.

The common green-light-emitting layer 9a contains DPEPO (90%) serving as a host material, and 4CzIPN (10%) serving as the TADF material (thermally activated delayed fluorescence material) serving as the green fluorescence light-emitting material (green fluorescence dopant). The common green-light-emitting layer 9a has a film thickness of 10 nm.

In the embodiment, the reason of why the TADF material (thermally activated delayed fluorescence material) is used for not only the common blue-light-emitting layer 7a, but also the common green-light-emitting layer 9a is that, although the common blue-light-emitting layer 7a is basically designed as an exciton generation layer, based on a relationship between hole mobility and electron mobility in other layers, excitons may be generated even in the common green-light-emitting layer 9a arranged adjacent to the common blue-light-emitting layer 7a in the G subpixel and the R subpixel. On the other hand, in the B subpixel, the first separation layer 8 is present between the common blue-light-emitting layer 7a and the common green-light-emitting layer 9a, which makes it unlikely that excitons are generated in the common green-light-emitting layer 9a. As a result, in the B subpixel, no G light emission occurs, achieving B light emission only.

The reason why the TADF material (thermally activated delayed fluorescence material) is used as a fluorescence light-emitting material (fluorescence dopant) is as described below.

It has been taken into account that, in the common blue-light-emitting layer 7 and the common green-light-emitting layer 9, 75% of excitons generated as the triplet level are thermally deactivated without emitting light.

Figure 13A:
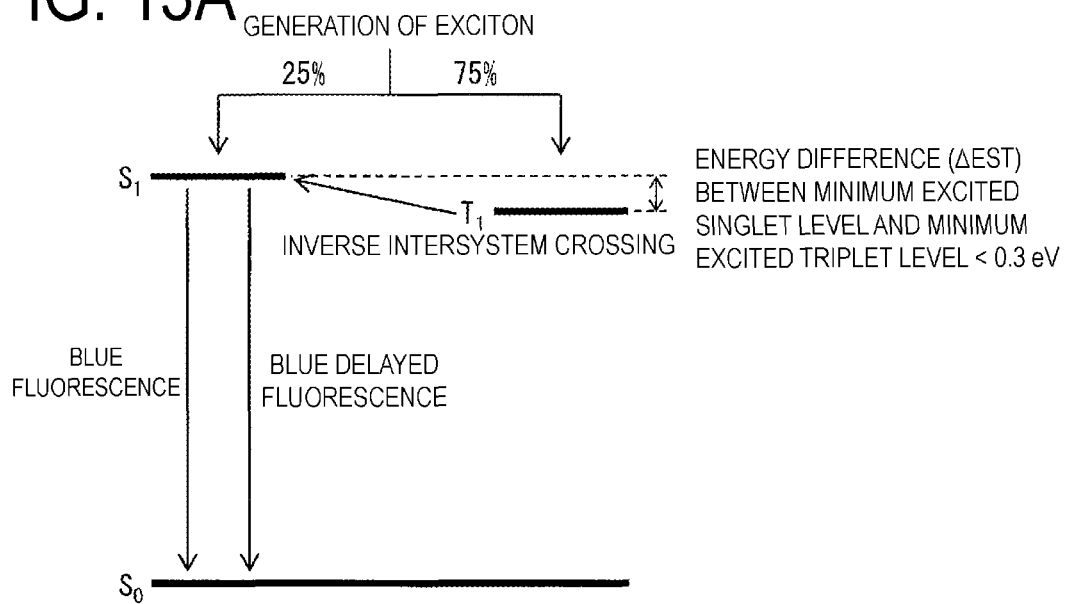
FIGS. 13A and 13B are diagrams for describing a reason of why light-emitting efficiency improves when a TADF material (thermally activated delayed fluorescence material) is used as a fluorescence light-emitting material (fluorescence dopant).
Figure 13B:
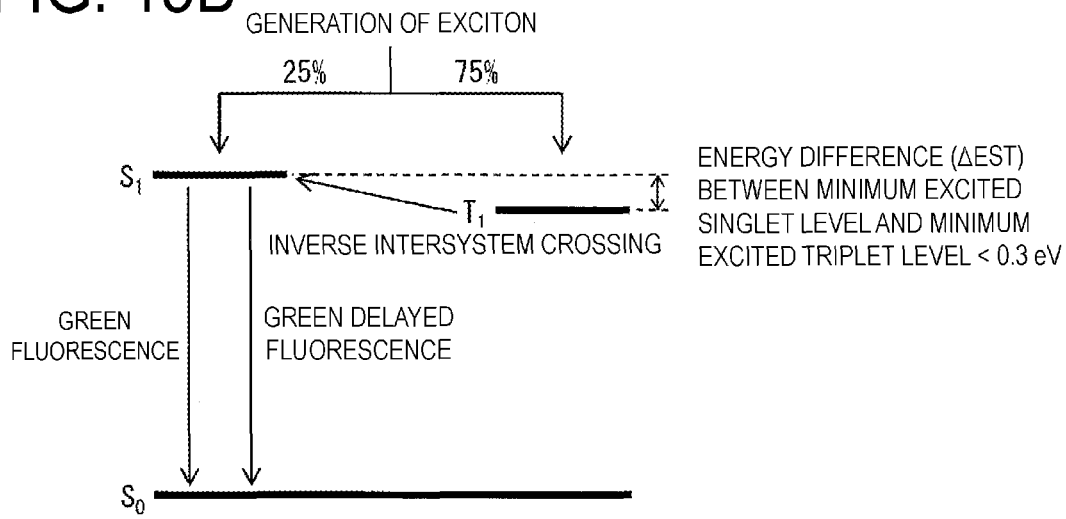

FIGS. 13A and 13B are diagrams for describing a reason of why light-emitting efficiency improves when the TADF material (thermally activated delayed fluorescence material) is used as a fluorescence light-emitting material (fluorescence dopant).

FIG. 13A illustrates a light emission mechanism when DMAC-DPS is used as the TADF material (thermally activated delayed fluorescence material) serving as the blue fluorescence light-emitting material (blue fluorescence dopant). FIG. 13B illustrates a light emission mechanism when 4CzIPN is used as the TADF material (thermally activated delayed fluorescence material) serving as the green fluorescence light-emitting material (green fluorescence dopant).

As illustrated in FIG. 13A, the DMAC-DPS is the TADF material (thermally activated delayed fluorescence material) having an energy difference (AEST) of less than 0.3 eV between a minimum excited singlet level and a minimum excited triplet level. When 25% of singlet excitons (excitons at an $S_1$ energy level) generated in the common blue-light-emitting layer 7a reach a ground state ($S_0$), the excitons emit blue fluorescence. When 75% of triplet excitons (excitons at a $T_1$ energy level) generated in the common blue-light-emitting layer 7a become excitons at the $S_1$ energy level through inverse intersystem crossing, and reach the ground state ($S_0$), the excitons emit blue delayed fluorescence. As a result, light-emitting efficiency can greatly improve.

As illustrated in FIG. 13B, the 4CzIPN is the TADF material (thermally activated delayed fluorescence material) having an energy difference (AEST) of less than 0.3 eV between the minimum excited singlet level and the minimum excited triplet level. When 25% of singlet excitons (excitons at the $S_1$ energy level) generated in the common green-light-emitting layer 9a reach the ground state ($S_0$), the excitons emit green fluorescence. When 75% of triplet excitons (excitons at the $T_1$ energy level) generated in the common green-light-emitting layer 9a become excitons at the $S_1$ energy level through inverse intersystem crossing, and reach the ground state ($S_0$), the excitons emit green delayed fluorescence. As a result, light-emitting efficiency can greatly improve.

Although not illustrated in FIG. 13B, the singlet excitons in the common green-light-emitting layer 9a in the G subpixel and the R subpixel include excitons having undergone the Förster transition from the common blue-light-emitting layer 7a. As described above, in the common green-light-emitting layer 9a, only the common green-light-emitting layer 9a in the G subpixel and the R subpixel can generate excitons.

In the embodiment, an example of a case when the TADF material (thermally activated delayed fluorescence material) is used for both the blue fluorescence light-emitting material (blue fluorescence dopant) and the green fluorescence light-emitting material (green fluorescence dopant) has been described. However, the disclosure is not limited to the embodiment. Even when the TADF material (thermally activated delayed fluorescence material) is used for either of the blue fluorescence light-emitting material (blue fluorescence dopant) and the green fluorescence light-emitting material (green fluorescence dopant), light-emitting efficiency can be improved.

Fourth Embodiment

Next, a fourth embodiment of the disclosure will be described with reference to FIG. 14. An organic EL display device 41 according to the embodiment is similar or identical to the third embodiment described above, except that, a first separation layer formed in the B subpixel has a two-layer structure including a first layer 37 and a second layer 38. For convenience of explanation, members having the same function as those illustrated in the drawings of the third embodiment are denoted using the same reference numerals, and descriptions thereof will be omitted.

Figure 14:
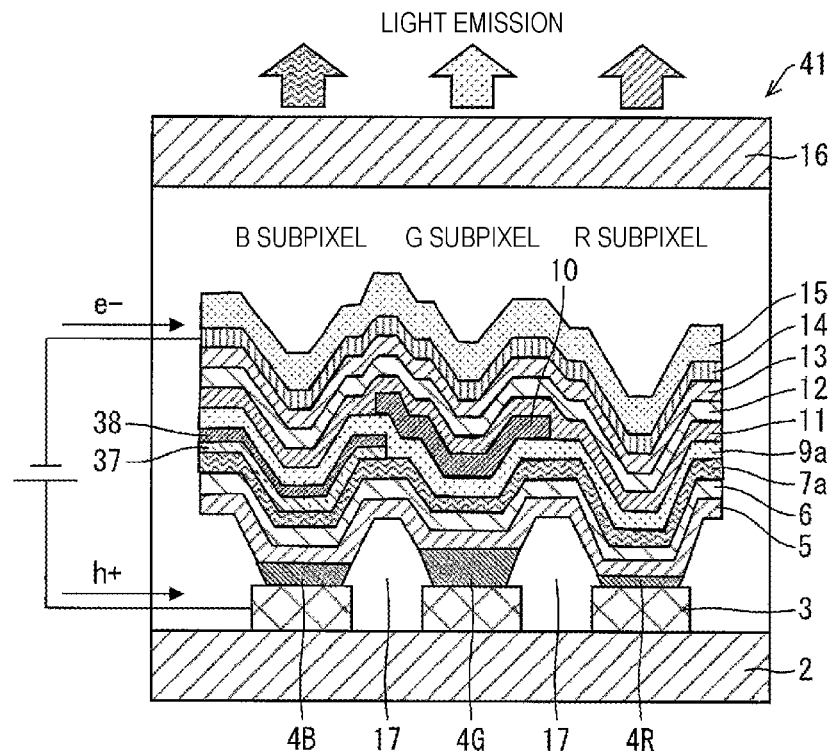
FIG. 14 is a view illustrating a schematic configuration of an organic EL display device according to a fourth embodiment of the disclosure.

FIG. 14 is a view illustrating a schematic configuration of the organic EL display device 41.

As illustrated, instead of the first separation layer 8 in the organic EL display device 31 illustrated in FIG. 12, the two-layer structure including the first layer 37 and the second layer 38 is used as the first separation layer.

The first layer 37 is made of BCP at a film thickness of 10 nm. The second layer 38 is made of DPEPO at a film thickness of 10 nm.

As described above, the first separation layer formed in the B subpixel has the two-layer structure including the first layer 37 and the second layer 38. The two layers have a total film thickness of 15 nm or greater.

In the embodiment, an example of a case when the first separation layer formed in the B subpixel has the two-layer structure has been described. However, the disclosure is not limited to the embodiment. As long as a total film thickness is 15 nm or greater, a structure may include three or more layers.

The first separation layer may be made of a mixed material.

When the first separation layer includes two or more layers, or is made of a mixed material, mobility of carriers (electrons and holes) can be relatively easily adjusted. By optimizing carrier balancing, control precision in exciton generation positions can be improved. As a result, light-emitting efficiency can be improved.

The first separation layer formed in the B subpixel has been described so far as an example. Obviously, the second separation layer formed in the G subpixel can also have two or more layers, or be made of a mixed material.

Fifth Embodiment

Next, a fifth embodiment of the disclosure will be described with reference to FIGS. 15, 16A, and 16B. Around an interface of two adjacent common light-emitting layers that are in direct contact with each other, when energy transfer of 75% of excitons generated at the triplet level in one of the light-emitting layers adjacent to each other to the triplet level in another of the light-emitting layers adjacent to each other, i.e., Dexter transition, occurs, the excitons are thermally deactivated without emitting light. Different from the third embodiment, organic EL display devices 51, 52, and 53 according to the embodiment include block layers 45 and 47 configured to prevent energy transfer between the triplet levels, i.e., the Dexter transition, from occurring. For convenience of explanation, members having the same function as those illustrated in the drawings of the third embodiment are denoted using the same reference numerals, and descriptions thereof will be omitted.

Figure 15:
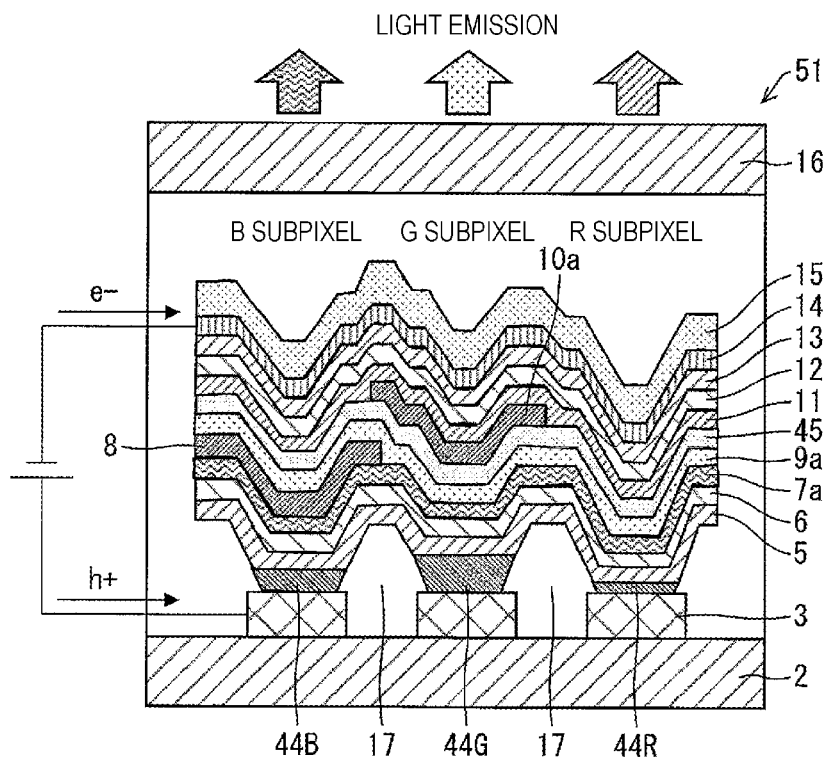
FIG. 15 is a view illustrating a schematic configuration an organic EL display device according to a fifth embodiment of the disclosure.

FIG. 15 is a view illustrating a schematic configuration of the organic EL display device 51.

As illustrated in the organic EL display device 51, the block layer 45 configured to prevent energy transfer between the triplet levels, i.e., the Dexter transition, from occurring is provided, as a single common layer over the B subpixel, the G subpixel, and the R subpixel, between the common green-light-emitting layer 9a and the common red-light-emitting layer 11, and, in the G subpixel, between a second separation layer 10a and the common green-light-emitting layer 9a.

To prevent the Dexter transition from occurring, but to allow the Förster transition to occur, it is required that the block layer 45 be formed at a film thickness equal to or below the Förster radius. To achieve this in the organic EL display device 51, DPEPO is formed at a film thickness of 5 nm. However, the disclosure is not limited to the embodiment. A material having required carrier (electron or hole) mobility may be formed at a film thickness equal to or below the Förster radius.

A maximum film thickness of the block layer 45 is preferably equal to or below 15 nm. The block layer 45 is preferably formed at a film thickness of 10 nm or less. Further, the block layer 45 is more preferably formed at a film thickness of 5 nm or less. For a minimum film thickness, the block layer 45 is preferably formed at a film thickness of 1 nm or greater. Further, the block layer 45 is more preferably formed at a film thickness of 2 nm or greater.

In the G subpixel in the organic EL display device 51, the second separation layer 10a is made of BCP at a film thickness equal to or below the Förster radius, i.e., 10 nm. However, a total film thickness of the block layer 45 and the second separation layer 10a provided immediately above the block layer 45 exceeds the Förster radius, i.e., 15 nm. In the G subpixel, the Förster transition between the common green-light-emitting layer 9a and the common red-light-emitting layer 11 is prevented from occurring, achieving G light emission.

A positive electrode 44B of the B subpixel is made of ITO at a film thickness of 90 nm. A positive electrode 44G of the G subpixel is made of ITO at a film thickness of 150 nm. A positive electrode 44R of the R subpixel is made of ITO at a film thickness of 35 nm.

In the organic EL display device 51, the common green-light-emitting layer 9a contains the TADF material (thermally activated delayed fluorescence material) serving as the green fluorescence light-emitting material (green fluorescence dopant). In the R subpixel, the block layer 45 prevents triplet excitons from being generated through the Dexter transition of triplet excitons in the common green-light-emitting layer 9a to the common red-light-emitting layer 11. Singlet excitons in the common green-light-emitting layer 9a increase through inverse intersystem crossing in the common green-light-emitting layer 9a. The Förster transition occurs from the common green-light-emitting layer 9a to the common red-light-emitting layer 11. As a result, light-emitting efficiency can be improved.

An absorption spectrum of the block layer 45 preferably does not overlap with a photoluminescence light-emitting spectrum of the blue fluorescence light-emitting material (blue fluorescence dopant) contained in the common blue-light-emitting layer 7a and a photoluminescence light-emitting spectrum of the green fluorescence light-emitting material (green fluorescence dopant) contained in the common green-light-emitting layer 9a.

Figure 16A:
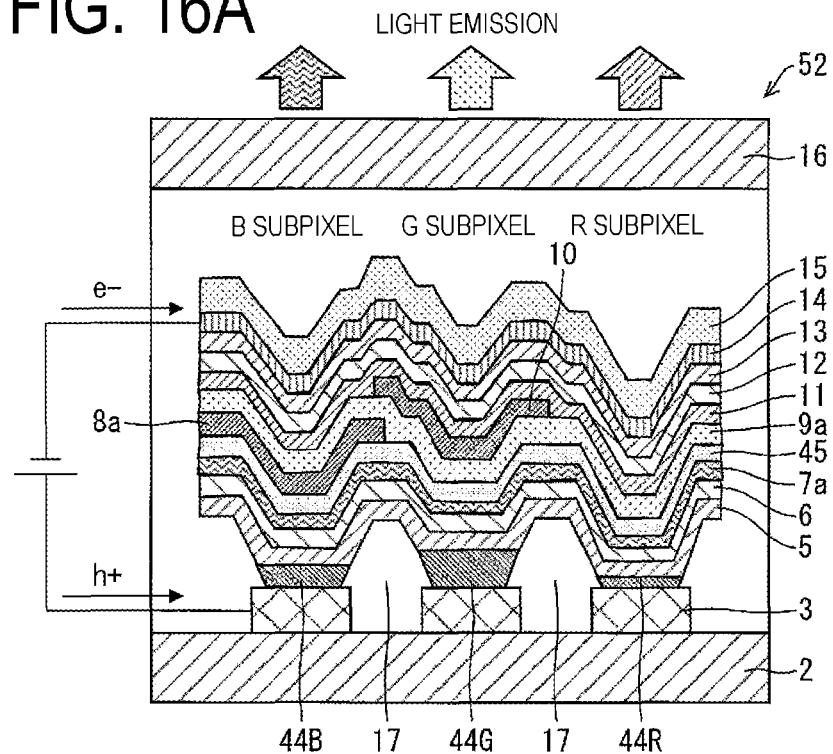
FIGS. 16A and 16B are views illustrating schematic configurations of other organic EL display devices according to the fifth embodiment of the disclosure.

FIG. 16A is a view illustrating a schematic configuration of the organic EL display device 52.

As illustrated, in the organic EL display device 52, the block layer 45 configured to prevent energy transfer between the triplet levels, i.e., the Dexter transition, from occurring is provided, as a single common layer over the B subpixel, the G subpixel, and the R subpixel, between the common blue-light-emitting layer 7a and the common green-light-emitting layer 9a, and, in the B subpixel, between the common blue-light-emitting layer 7a and a first separation layer 8a.

To prevent the Dexter transition from occurring, but to allow the Förster transition to occur, it is required that the block layer 45 be formed at a film thickness equal to or below the Förster radius. To achieve this in the organic EL display device 52, DPEPO is formed at a film thickness of 5 nm. However, the disclosure is not limited to the embodiment. A material having required carrier (electron or hole) mobility may be formed at a film thickness equal to or below the Förster radius.

In the B subpixel in the organic EL display device 52, the first separation layer 8a is made of BCP at a film thickness equal to or below the Förster radius, i.e., 10 nm. However, a total film thickness of the block layer 45 and the first separation layer 8a provided immediately above the block layer 45 exceeds the Förster radius, i.e., 15 nm. In the B subpixel, the Förster transition between the common blue-light-emitting layer 7a and the common green-light-emitting layer 9a is prevented from occurring, achieving B light emission.

In the embodiment, the total film thickness of the block layer 45 and the first separation layer 8a provided immediately above the block layer 45 is 15 nm. However, the disclosure is not limited to the embodiment. The total film thickness preferably ranges from 15 nm to 50 nm, both inclusive. Further, the total film thickness preferably ranges from 15 nm to 30 nm, both inclusive.

In the organic EL display device 52, the common blue-light-emitting layer 7a contains the TADF material (thermally activated delayed fluorescence material) serving as the blue fluorescence light-emitting material (blue fluorescence dopant). In the G subpixel and the R subpixel, the block layer 45 prevents triplet excitons from being generated through the Dexter transition of triplet excitons in the common blue-light-emitting layer 7a to the common green-light-emitting layer 9a. Singlet excitons in the common blue-light-emitting layer 7a increase through inverse intersystem crossing in the common blue-light-emitting layer 7a. The Förster transition occurs from the common blue-light-emitting layer 7a to the common green-light-emitting layer 9a. As a result, light-emitting efficiency can be improved.

The absorption spectrum of the block layer 45 preferably does not overlap with the photoluminescence light-emitting spectrum of the blue fluorescence light-emitting material (blue fluorescence dopant) contained in the common blue-light-emitting layer 7a.

Figure 16B:
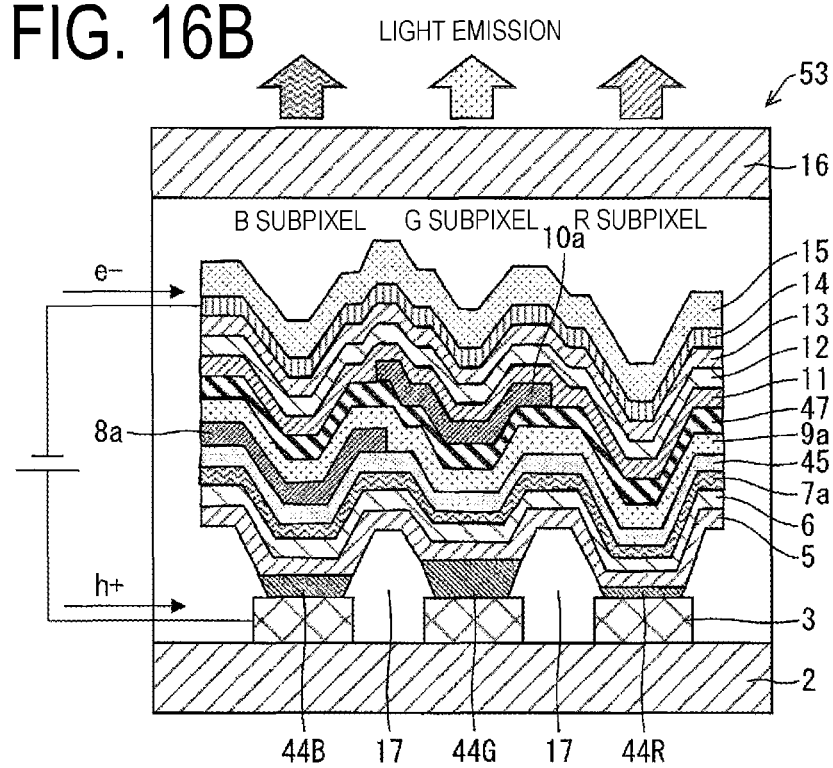

FIG. 16B is a view illustrating a schematic configuration of the organic EL display device 53.

As illustrated in the organic EL display device 53, the block layer 45 configured to prevent energy transfer between the triplet levels, i.e., the Dexter transition, from occurring is provided, as a single common layer over the B subpixel, the G subpixel, and the R subpixel, between the common blue-light-emitting layer 7a and the common green-light-emitting layer 9a, and, in the B subpixel, between the common blue-light-emitting layer 7a and the first separation layer 8a. The block layer 47 configured to prevent energy transfer between the triplet levels, i.e., the Dexter transition, from occurring is provided, as a single common layer over the B subpixel, the G subpixel, and the R subpixel, between the common green-light-emitting layer 9a and the common red-light-emitting layer 11, and, in the G subpixel, between the common green-light-emitting layer 9a and the second separation layer 10a.

To prevent the Dexter transition from occurring, but to allow the Förster transition to occur, it is required that the block layer 45 and the block layer 47 each be formed at a film thickness equal to or below the Förster radius. To achieve this in the organic EL display device 53, DPEPO is formed at a film thickness of 5 nm. However, the disclosure is not limited to the embodiment. A material having required carrier (electron or hole) mobility may be formed at a film thickness equal to or below the Förster radius.

In the B subpixel in the organic EL display device 53, the first separation layer 8a is made of BCP at a film thickness equal to or below the Förster radius, i.e., 10 nm. However, a total film thickness of the block layer 45 and the first separation layer 8a provided immediately above the block layer 45 exceeds the Förster radius, i.e., 15 nm. In the B subpixel, the Förster transition between the common blue-light-emitting layer 7a and the common green-light-emitting layer 9a is prevented from occurring, achieving B light emission.

In the G subpixel in the organic EL display device 53, the second separation layer 10a is made of BCP at a film thickness equal to or below the Förster radius, i.e., 10 nm. However, a total film thickness of the block layer 47 and the second separation layer 10a provided immediately above the block layer 47 exceeds the Förster radius, i.e., 15 nm. In the G subpixel, the Förster transition between the common green-light-emitting layer 9a and the common red-light-emitting layer 11 is prevented from occurring, achieving G light emission.

In the embodiment, the total film thickness of the block layer 47 and the second separation layer 10a provided immediately above the block layer 47 is 15 nm. However, the disclosure is not limited to the embodiment. The total film thickness may range from 15 nm to 50 nm, both inclusive. Further, the total film thickness preferably ranges from 15 nm to 30 nm, both inclusive.

In the organic EL display device 53, the common blue-light-emitting layer 7a and the common green-light-emitting layer 9a contain the TADF material (thermally activated delayed fluorescence material) serving as a fluorescence light-emitting material (fluorescence dopant).

As a result, in the G subpixel and the R subpixel, the block layer 45 prevents triplet excitons from being generated through the Dexter transition of triplet excitons in the common blue-light-emitting layer 7a to the common green-light-emitting layer 9a. Singlet excitons in the common blue-light-emitting layer 7a increase through inverse intersystem crossing in the common blue-light-emitting layer 7a. The Förster transition occurs from the common blue-light-emitting layer 7a to the common green-light-emitting layer 9a. As a result, light-emitting efficiency can be improved. In the R subpixel, the block layer 47 prevents triplet exciton from being generated through the Dexter transition of triplet excitons in the common green-light-emitting layer 9a to the common red-light-emitting layer 11. Singlet excitons in the common green-light-emitting layer 9a increase through inverse intersystem crossing in the common green-light-emitting layer 9a. The Förster transition occurs from the common green-light-emitting layer 9a to the common red-light-emitting layer 11. As a result, light-emitting efficiency can be improved.

The absorption spectrum of the block layer 45 preferably does not overlap with the photoluminescence light-emitting spectrum of the blue fluorescence light-emitting material (blue fluorescence dopant) contained in the common blue-light-emitting layer 7a. An absorption spectrum of the block layer 47 preferably does not overlap with the photoluminescence light-emitting spectrum of the blue fluorescence light-emitting material (blue fluorescence dopant) contained in the common blue-light-emitting layer 7a and the photoluminescence light-emitting spectrum of the green fluorescence light-emitting material (green fluorescence dopant) contained in the common green-light-emitting layer 9a.

Sixth Embodiment

Next, a sixth embodiment of the disclosure will be described with reference to FIG. 17. Different from the third embodiment, in an organic EL display device 71 according to the embodiment, a common red-light-emitting layer 11b is arranged below a common blue-light-emitting layer 7b and a common green-light-emitting layer 9b, and the common blue-light-emitting layer 7b is arranged above the common green-light-emitting layer 9b. For convenience of explanation, members having the same function as those illustrated in the drawings of the third embodiment are denoted using the same reference numerals, and descriptions thereof will be omitted.

Figure 17:
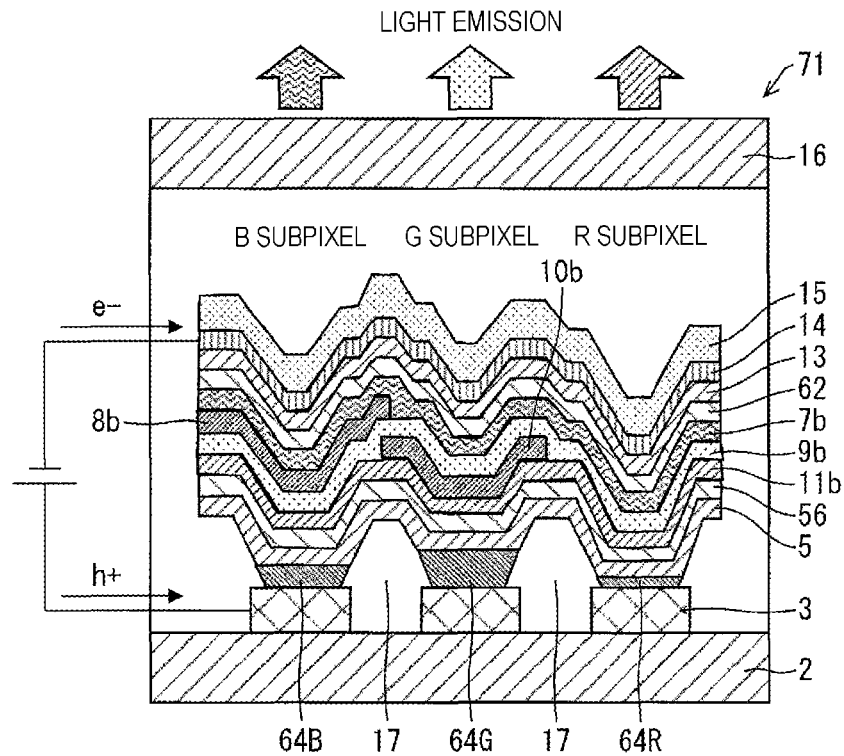
FIG. 17 is a view illustrating a schematic configuration of an organic EL display device according to a sixth embodiment of the disclosure.

FIG. 17 is a view illustrating a schematic configuration of the organic EL display device 71.

In the embodiment, for each subpixel, the following layers having respective thicknesses are layered on the substrate 2 in the described order.

As illustrated, in the B subpixel, a blue-light-emitting organic EL element is provided. The reflective electrode 3: Ag (100 nm), a positive electrode 64B: ITO (90 nm), the hole injection layer 5: HAT-CN (10 nm), a hole transport layer 56: TCTA (20 nm), the common red-light-emitting layer 11b: mCP/DCM (10%) (10 nm), the common green-light-emitting layer 9b: mCP/4CzIPN (10%) (10 nm), a first separation layer 8b: mCP (30 nm), the common blue-light-emitting layer 7b: DPEPO/DMAC-DPS (10%) (10 nm), an electron transport layer 62: DPEPO (30 nm), the electron injection layer 13: LiF (1 nm), the negative electrode 14: Ag/Mg alloy (Ag/Mg combination ratio=0.9:0.1) (20 nm), and the protection layer 15: ITO (80 nm) are layered to form the blue-light-emitting organic EL element.

In the G subpixel, a green-light-emitting organic EL element is provided. The reflective electrode 3: Ag (100 nm), a positive electrode 64G: ITO (130 nm), the hole injection layer 5: HAT-CN (10 nm), the hole transport layer 56: TCTA (20 nm), the common red-light-emitting layer 11b: mCP/DCM (10%) (10 nm), a second separation layer 10b: mCP (30 nm), the common green-light-emitting layer 9b: mCP/4CzIPN (10%) (10 nm), the common blue-light-emitting layer 7b: DPEPO/DMAC-DPS (10%) (10 nm), the electron transport layer 62: DPEPO (30 nm), the electron injection layer 13: LiF (1 nm), the negative electrode 14: Ag/Mg alloy (Ag/Mg combination ratio=0.9:0.1) (20 nm), and the protection layer 15: ITO (80 nm) are layered to form the green-light-emitting organic EL element.

In the R subpixel, a red-light-emitting organic EL element is provided. The reflective electrode 3: Ag (100 nm), a positive electrode 64R: ITO (40 nm), the hole injection layer 5: HAT-CN (10 nm), the hole transport layer 56: TCTA (20 nm), the common red-light-emitting layer 11b: mCP/DCM (10%) (10 nm), the common green-light-emitting layer 9b: mCP/4CzIPN (10%) (10 nm), the common blue-light-emitting layer 7b: DPEPO/DMAC-DPS (10%) (10 nm), the electron transport layer 62: DPEPO (30 nm), the electron injection layer 13: LiF (1 nm), the negative electrode 14: Ag/Mg alloy (Ag/Mg combination ratio=0.9:0.1) (20 nm), and the protection layer 15: ITO (80 nm) are layered to form the red-light-emitting organic EL element.

As described above, by selecting and combining the hole transport layer 56, the electron transport layer 62, the first separation layer 8b, the second separation layer 10b, a host material for the common blue-light-emitting layer 7b, a host material for the common green-light-emitting layer 9b, and a host material for the common red-light-emitting layer 11b, and by adjusting carrier balancing, the common blue-light-emitting layer 7b can be used as an exciton generation layer.

The organic EL display device 71 is configured to have stronger hole transportability as a whole. By reversing a layer order of the common blue-light-emitting layer 7b, the common green-light-emitting layer 9b, and the common red-light-emitting layer 11b from the layer order in the first to fifth embodiments, described above, and by arranging the common blue-light-emitting layer 7b adjacent to the negative electrode 14, exciton generation positions can be controlled in the common blue-light-emitting layer 7b.

As described above, by changing a layer order of a blue-light-emitting layer, a common green-light-emitting layer, and a common red-light-emitting layer, exciton generation positions can be controlled. When selecting a hole transport layer, an electron transport layer, a first separation layer, a second separation layer, a host material for a common blue-light-emitting layer, a host material for a common green-light-emitting layer, and a host material for a common red-light-emitting layer, it can be first taken into account that the singlet energy level ($S_1$) and the triplet energy level ($T_1$) are higher, instead of hole mobility and electron mobility, suppressing an efficiency loss due to energy transfer to peripheral materials. As a result, light-emitting efficiency can be improved.

Seventh Embodiment

Next, a seventh embodiment of the disclosure will be described with reference to FIG. 18. Different from the third and sixth embodiments, in an organic EL display device 81 according to the embodiment, the common red-light-emitting layer 11 is arranged above the common blue-light-emitting layer 7b and the common green-light-emitting layer 9b, and the common blue-light-emitting layer 7b is arranged above the common green-light-emitting layer 9b. For convenience of explanation, members having the same function as those illustrated in the drawings of the third and sixth embodiments are denoted using the same reference numerals, and descriptions thereof will be omitted.

Figure 18:
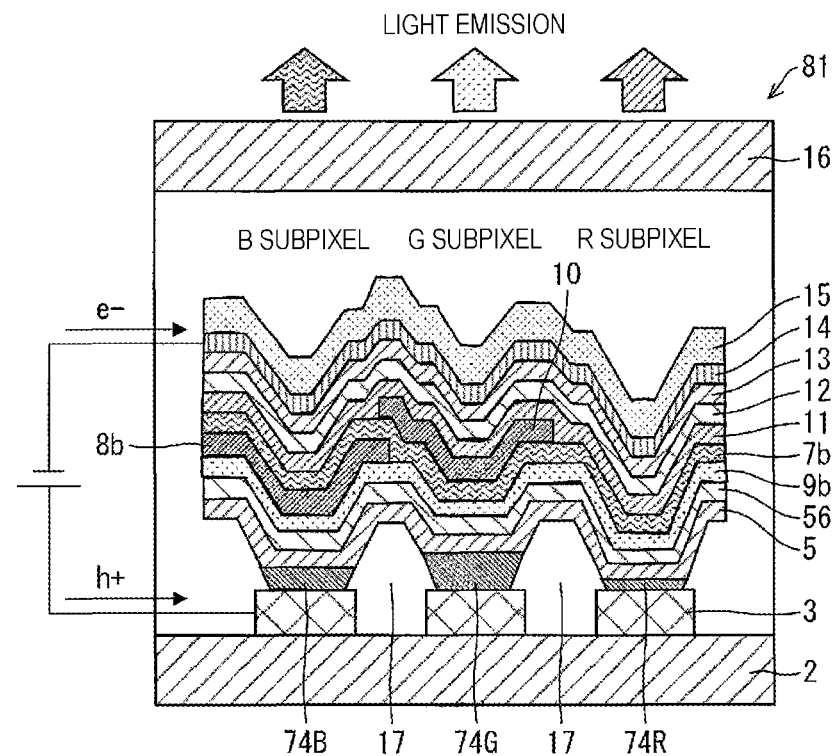
FIG. 18 is a view illustrating a schematic configuration of an organic EL display device according to a seventh embodiment of the disclosure.

FIG. 18 is a view illustrating a schematic configuration of the organic EL display device 81.

In the embodiment, for each subpixel, the following layers having respective thicknesses are layered on the substrate 2 in the described order.

As illustrated, in the B subpixel, a blue-light-emitting organic EL element is provided. The reflective electrode 3: Ag (100 nm), a positive electrode 74B: ITO (90 nm), the hole injection layer 5: HAT-CN (10 nm), the hole transport layer 56: TCTA (20 nm), the common green-light-emitting layer 9b: mCP/4CzIPN (10%) (10 nm), the first separation layer 8b: mCP (30 nm), the common blue-light-emitting layer 7b: DPEPO/DMAC-DPS (10%) (5 nm), the common red-light-emitting layer 11: BCP/DCM (10%) (10 nm), the electron transport layer 12: BCP (30 nm), the electron injection layer 13: LiF (1 nm), the negative electrode 14: Ag/Mg alloy (Ag/Mg combination ratio=0.9:0.1) (20 nm), and the protection layer 15: ITO (80 nm) are layered to form the blue-light-emitting organic EL element.

In the G subpixel, a green-light-emitting organic EL element is provided. The reflective electrode 3: Ag (100 nm), a positive electrode 74G: ITO (140 nm), the hole injection layer 5: HAT-CN (10 nm), the hole transport layer 56: TCTA (20 nm), the common green-light-emitting layer 9b: mCP/4CzIPN (10%) (10 nm), the common blue-light-emitting layer 7b: DPEPO/DMAC-DPS (10%) (5 nm), the second separation layer 10: BCP (30 nm), the common red-light-emitting layer 11: BCP/DCM (10%) (10 nm), the electron transport layer 12: BCP (30 nm), the electron injection layer 13: LiF (1 nm), the negative electrode 14: Ag/Mg alloy (Ag/Mg combination ratio=0.9:0.1) (20 nm), and the protection layer 15: ITO (80 nm) are layered to form the green-light-emitting organic EL element.

In the R subpixel, a red-light-emitting organic EL element is provided. The reflective electrode 3: Ag (100 nm), a positive electrode 74R: ITO (45 nm), the hole injection layer 5: HAT-CN (10 nm), the hole transport layer 56: TCTA (20 nm), the common green-light-emitting layer 9b: mCP/4CzIPN (10%) (10 nm), the common blue-light-emitting layer 7b: DPEPO/DMAC-DPS (10%) (5 nm), the common red-light-emitting layer 11: BCP/DCM (10%) (10 nm), the electron transport layer 12: BCP (30 nm), the electron injection layer 13: LiF (1 nm), the negative electrode 14: Ag/Mg alloy (Ag/Mg combination ratio=0.9:0.1) (20 nm), and the protection layer 15: ITO (80 nm) are layered to form the red-light-emitting organic EL element.

As described above, by selecting and combining the hole transport layer 56, the electron transport layer 12, the first separation layer 8b, the second separation layer 10, a host material for the common blue-light-emitting layer 7b, a host material for the common green-light-emitting layer 9b, and a host material for the common red-light-emitting layer 11, and by adjusting carrier balancing, the common blue-light-emitting layer 7b can be used as an exciton generation layer.

In the whole organic EL display device 81, hole transportability and electron transportability are configured to be identical as a whole. By arranging the common blue-light-emitting layer 7b between the common green-light-emitting layer 9b and the common red-light-emitting layer 11, exciton generation positions can be controlled in the common blue-light-emitting layer 7b.

As described above, by changing a layer order of a blue-light-emitting layer, a common green-light-emitting layer, and a common red-light-emitting layer, exciton generation positions can be controlled. When selecting a hole transport layer, an electron transport layer, a first separation layer, a second separation layer, a host material for a common blue-light-emitting layer, a host material for a common green-light-emitting layer, and a host material for a common red-light-emitting layer, it can be first taken into account that the singlet energy level ($S_1$) and the triplet energy level ($T_1$) are higher, instead of hole mobility and electron mobility, suppressing an efficiency loss due to energy transfer to peripheral materials. As a result, light-emitting efficiency can be improved.

Eighth Embodiment

Next, an eighth embodiment of the disclosure will be described with reference to FIG. 19. Different from the third, sixth, and seventh embodiments, in an organic EL display device 91 according to the embodiment, the common red-light-emitting layer 11b is arranged below the common blue-light-emitting layer 7b and a common green-light-emitting layer 9c, and the common green-light-emitting layer 9c is arranged above the common blue-light-emitting layer 7b. For convenience of explanation, members having the same function as those illustrated in the drawings of the third, sixth, and seventh embodiments are denoted using the same reference numerals, and descriptions thereof will be omitted.

Figure 19:
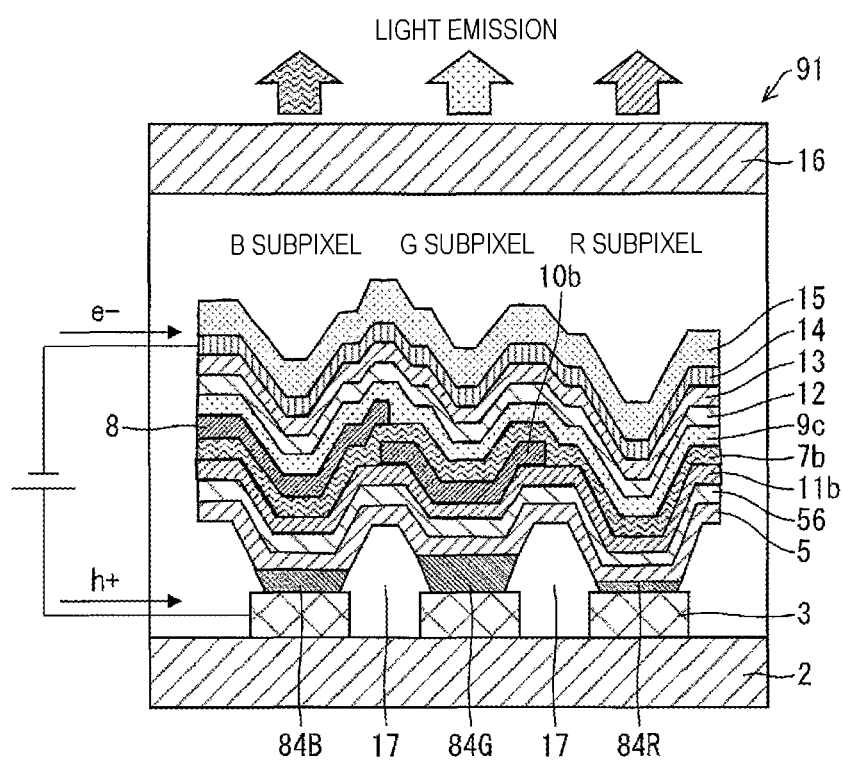
FIG. 19 is a view illustrating a schematic configuration of an organic EL display device according to an eighth embodiment of the disclosure.
Figure 20A:
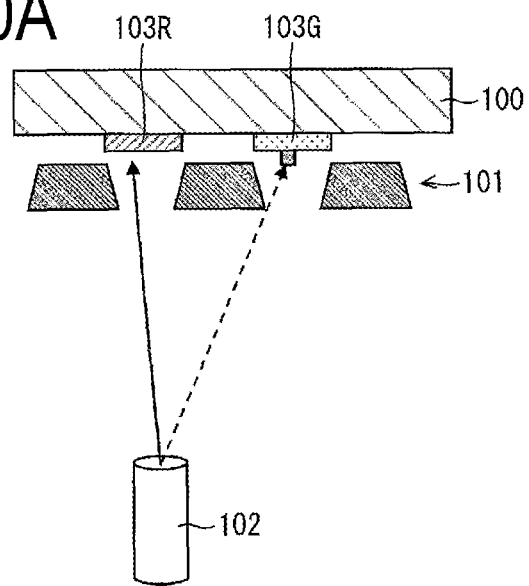
FIGS. 20A and 20B are diagrams for describing problems in a known organic EL display device having organic EL elements configured to emit light in respective colors of subpixels, the organic EL elements being formed through separately patterning vapor deposition performed three times for a red-light-emitting layer, a green-light-emitting layer, and a blue-light-emitting layer.
Figure 20B:
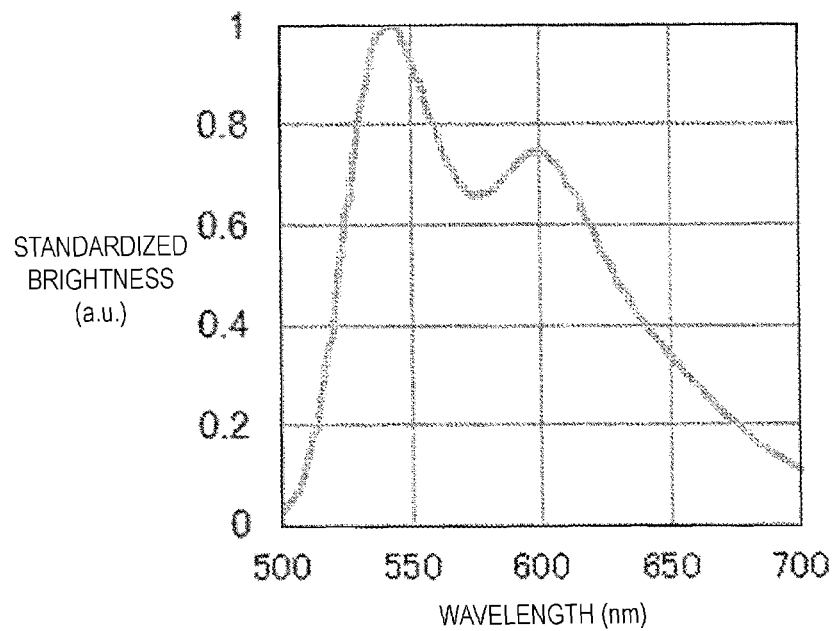
Figure 21A:
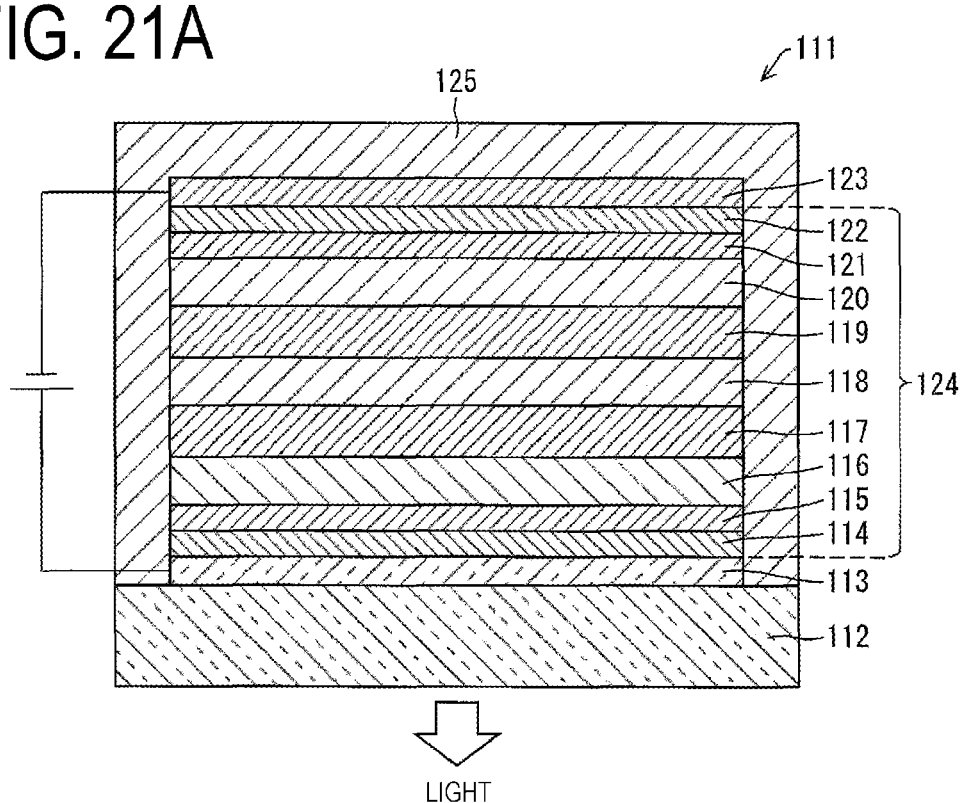
FIGS. 21A and 21B are views illustrating schematic configurations of known organic EL display devices disclosed in PTL 1 and PTL 2.
Figure 21B:
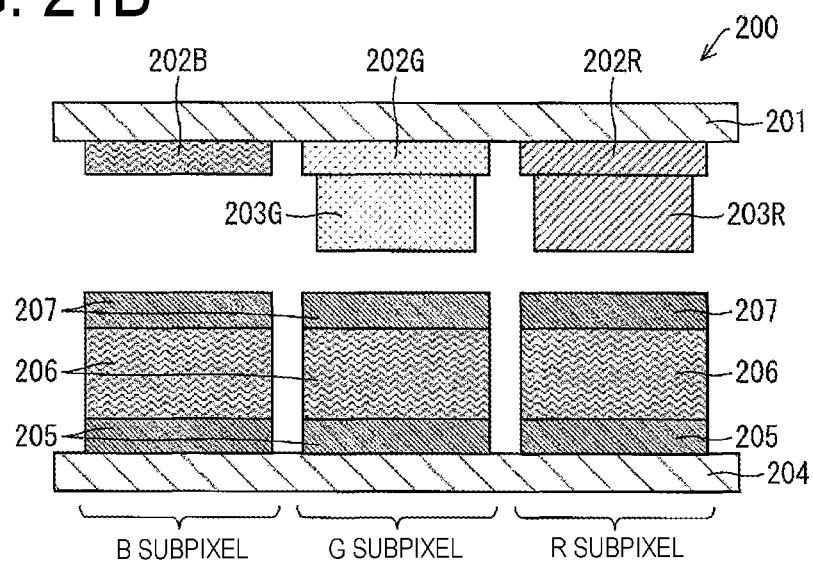

FIG. 19 is a view illustrating a schematic configuration of the organic EL display device 91.

In the embodiment, for each subpixel, the following layers having respective thicknesses are layered on the substrate 2 in the described order.

As illustrated, in the B subpixel, a blue-light-emitting organic EL element is provided. The reflective electrode 3:

Ag (100 nm), a positive electrode 84B: ITO (95 nm), the hole injection layer 5: HAT-CN (10 nm), the hole transport layer 56: TCTA (20 nm), the common red-light-emitting layer 11b: mCP/DCM (10%) (10 nm), the common blue-light-emitting layer 7b: DPEPO/DMAC-DPS (10%) (5 nm), the first separation layer 8: BCP (30 nm), the common green-light-emitting layer 9c: BCP/4CzIPN (10%) (10 nm), the electron transport layer 12: BCP (30 nm), the electron injection layer 13: LiF (1 nm), the negative electrode 14: Ag/Mg alloy (Ag/Mg combination ratio=0.9:0.1) (20 nm), and the protection layer 15: ITO (80 nm) are layered to form the blue-light-emitting organic EL element.

In the G subpixel, a green-light-emitting organic EL element is provided. The reflective electrode 3: Ag (100 nm), a positive electrode 84G: ITO (140 nm), the hole injection layer 5: HAT-CN (10 nm), the hole transport layer 56: TCTA (20 nm), the common red-light-emitting layer 11b: mCP/DCM (10%) (10 nm), the second separation layer 10b: mCP (30 nm), the common blue-light-emitting layer 7b: DPEPO/DMAC-DPS (10%) (5 nm), the common green-light-emitting layer 9c: BCP/4CzIPN (10%) (10 nm), the electron transport layer 12: BCP (30 nm), the electron injection layer 13: LiF (1 nm), the negative electrode 14: Ag/Mg alloy (Ag/Mg combination ratio=0.9:0.1) (20 nm), and the protection layer 15: ITO (80 nm) are layered to form the green-light-emitting organic EL element.

In the R subpixel, a red-light-emitting organic EL element is provided. The reflective electrode 3: Ag (100 nm), a positive electrode 84R: ITO (45 nm), the hole injection layer 5: HAT-CN (10 nm), the hole transport layer 56: TCTA (20 nm), the common red-light-emitting layer 11b: mCP/DCM (10%) (10 nm), the common blue-light-emitting layer 7b: DPEPO/DMAC-DPS (10%) (5 nm), the common green-light-emitting layer 9c: BCP/4CzIPN (10%) (10 nm), the electron transport layer 12: BCP (30 nm), the electron injection layer 13: LiF (1 nm), the negative electrode 14: Ag/Mg alloy (Ag/Mg combination ratio=0.9:0.1) (20 nm), and the protection layer 15: ITO (80 nm) are layered to form the red-light-emitting organic EL element.

As described above, by selecting and combining the hole transport layer 56, the electron transport layer 12, the first separation layer 8, the second separation layer 10b, a host material for the common blue-light-emitting layer 7b, a host material for the common green-light-emitting layer 9c, and a host material for the common red-light-emitting layer 11b, and by adjusting carrier balancing, the common blue-light-emitting layer 7b can be used as an exciton generation layer.

In the whole organic EL display device 91, hole transportability and electron transportability are configured to be identical as a whole. By arranging the common blue-light-emitting layer 7b between the common green-light-emitting layer 9c and the common red-light-emitting layer 11b, exciton generation positions can be controlled in the common blue-light-emitting layer 7b.

As described above, by changing a layer order of a blue-light-emitting layer, a common green-light-emitting layer, and a common red-light-emitting layer, exciton generation positions can be controlled. When selecting a hole transport layer, an electron transport layer, a first separation layer, a second separation layer, a host material for a common blue-light-emitting layer, a host material for a common green-light-emitting layer, and a host material for a common red-light-emitting layer, it can be first taken into account that the singlet energy level ($S_1$) and the triplet energy level ($T_1$) are higher, instead of hole mobility and electron mobility, suppressing an efficiency loss due to energy transfer to peripheral materials. As a result, light-emitting efficiency can be improved.

Supplement

An organic EL display device according to a first aspect of the disclosure includes a plurality of pixels. The plurality of pixels each include a first subpixel, a second subpixel, and a third subpixel. The first, second, and third subpixels are configured to emit light with peak wavelengths different from each other. The first, second, and third subpixels each include a positive electrode, a negative electrode, and a light-emitting layer formed between the positive electrode and the negative electrode. Either of the positive electrode and the negative electrode is a reflective electrode or includes a reflective layer. Another of the positive electrode and the negative electrode is a transparent electrode or a translucent electrode configured to transmit the light with peak wavelengths different from each other. The light-emitting layer is a layered film including a first fluorescence light-emitting layer configured to emit light with a longest peak wavelength, a second fluorescence light-emitting layer configured to emit light with a shortest peak wavelength, and a third fluorescence light-emitting layer configured to emit light with a peak wavelength between the longest peak wavelength of the first fluorescence light-emitting layer and the shortest peak wavelength of the second fluorescence light-emitting layer. The first fluorescence light-emitting layer, the second fluorescence light-emitting layer, and the third fluorescence light-emitting layer are each formed as a single common layer in the plurality of pixels. The first fluorescence light-emitting layer is arranged above or below the second fluorescence light-emitting layer and the third fluorescence light-emitting layer. In the first subpixel, a first separation layer without containing a light-emitting material is provided between the second fluorescence light-emitting layer and the third fluorescence light-emitting layer. In the second subpixel, a second separation layer without containing a light-emitting material is provided between the first fluorescence light-emitting layer and a fluorescence light-emitting layer lying adjacent to the first fluorescence light-emitting layer.

According to the configuration, the first fluorescence light-emitting layer, the second fluorescence light-emitting layer, and the third fluorescence light-emitting layer are each formed as a single common layer in the plurality of pixels. The first fluorescence light-emitting layer, the second fluorescence light-emitting layer, and the third fluorescence light-emitting layer are not formed through separately patterning vapor deposition.

In separately patterning vapor deposition, vapor deposition films are formed through vapor deposition performed a plurality of times in a shape corresponding to each of the subpixels.

The first separation layer provided in the first subpixel and the second separation layer provided in the second subpixel do not contain a light-emitting material. Therefore, even when a vapor deposition material enters into one of subpixels adjacent to each other, color mixing between the subpixels adjacent to each other does not occur.

As a result, according to the configuration, even when a light-emitting layer is formed through separately patterning vapor deposition, and even when a vapor deposition material enters into one of subpixels adjacent to each other, color mixing between the subpixels adjacent to each other does not occur.

According to the configuration, the first subpixel, the second subpixel, and the third subpixel emit light with peak wavelengths different from each other through energy transfer between singlet levels in fluorescence light-emitting layers adjacent to each other present within the Förster radius, i.e., the Förster transition, without causing the first fluorescence light-emitting layer, the second fluorescence light-emitting layer, and the third fluorescence light-emitting layer to wholly emit light simultaneously, suppressing power consumption while being driven.

According to the configuration, the first subpixel, the second subpixel, and the third subpixel emit light with peak wavelengths different from each other through the Förster transition without requiring a separate color filter, suppressing manufacturing cost.

According to the configuration, the first subpixel, the second subpixel, and the third subpixel emit light with peak wavelengths different from each other through the Förster transition. Even when the first separation layer is formed in a thin film in a subpixel adjacent to the first subpixel and the second separation layer is formed in a thin film in a subpixel adjacent to the second subpixel, the first subpixel, the second subpixel, and the third subpixel can emit light with peak wavelengths different from each other. The reason is that the Förster transition occurs as long as the fluorescence light-emitting layers lie within the Förster radius, even when the fluorescence light-emitting layers are not in direct contact with each other.

According to the configuration, the first subpixel, the second subpixel, and the third subpixel emit light with peak wavelengths different from each other through the Förster transition. As a result, color mixing and color shifting between subpixels adjacent to each other due to light to be emitted obliquely do not occur.

As described above, according to the configuration, an organic EL display device with higher resolution, suppressed power consumption while being driven and low manufacturing cost, and no color mixing and color shifting between subpixels adjacent to each other can be achieved.

In an organic EL display device according to a second aspect of the disclosure, in the first aspect, the first fluorescence light-emitting layer is a light-emitting layer for red light, the second fluorescence light-emitting layer is a light-emitting layer for blue light, and the third fluorescence light-emitting layer is a light-emitting layer for green light.

According to the configuration, an organic EL display device configured to emit blue light in the first subpixel, green light in the second subpixel, and red light in the third subpixel can be achieved.

In an organic EL display device according to a third aspect of the disclosure, in the first or second aspect, at least either of the first separation layer and the second separation layer is a layered film of a plurality of layers.

According to the configuration, at least either of the first separation layer and the second separation layer is formed of a plurality of layers, increasing material selections.

In an organic EL display device according to a fourth aspect of the disclosure, in any one of the first to third aspects, the first separation layer preferably has a film thickness ranging from 15 nm to 50 nm, both inclusive.

According to the configuration, the Förster transition between the second fluorescence light-emitting layer and the third fluorescence light-emitting layer in the first subpixel can securely be prevented from occurring.

In an organic EL display device according to a fifth aspect of the disclosure, in any one of the first to fourth aspects, the second separation layer preferably has a film thickness ranging from 15 nm to 50 nm, both inclusive.

According to the configuration, the Förster transition between the first fluorescence light-emitting layer in the second subpixel and a fluorescence light-emitting layer lying adjacent to the first fluorescence light-emitting layer can securely be prevented from occurring.

In an organic EL display device according to a sixth aspect of the disclosure, in any one of the first to fifth aspects, a second fluorescence light-emitting material contained in the second fluorescence light-emitting layer preferably contains a thermally activated delayed fluorescence material with an energy difference of less than 0.3 eV between a minimum excited singlet level and a minimum excited triplet level.

According to the configuration, an organic EL display device with higher light-emitting efficiency can be achieved.

In an organic EL display device according to a seventh aspect of the disclosure, in any one of the first to sixth aspects, a third fluorescence light-emitting material contained in the third fluorescence light-emitting layer preferably contains a thermally activated delayed fluorescence material with an energy difference of less than 0.3 eV between a minimum excited singlet level and a minimum excited triplet level.

According to the configuration, an organic EL display device with higher light-emitting efficiency can be achieved.

In an organic EL display device according to an eighth aspect of the disclosure, in the sixth or seventh aspect, a first block layer without containing a light-emitting material may be formed between the first fluorescence light-emitting layer and a fluorescence light-emitting layer lying adjacent to the first fluorescence light-emitting layer as a single common layer in the plurality of pixels, and, in the second subpixel, a film thickness of the second separation layer and the first block layer preferably ranges from 15 nm to 50 nm, both inclusive.

According to the configuration, an organic EL display device with further higher light-emitting efficiency can be achieved.

In an organic EL display device according to a ninth aspect of the disclosure, in any one of the sixth to eighth aspects, a second block layer without containing a light-emitting material may be formed between the second fluorescence light-emitting layer and the third fluorescence light-emitting layer as a single common layer in the plurality of pixels, and, in the first subpixel, a film thickness of the first separation layer and the second block layer preferably range from 15 nm to 50 nm, both inclusive.

According to the configuration, an organic EL display device with further higher light-emitting efficiency can be achieved.

In an organic EL display device according to a tenth aspect of the disclosure, in any one of the first to ninth aspects, a wavelength range of a light-emitting spectrum of the second fluorescence light-emitting material contained in the second fluorescence light-emitting layer and a wavelength range of an absorption spectrum of the third fluorescence light-emitting material contained in the third fluorescence light-emitting layer overlap with each other within a predetermined wavelength range.

According to the configuration, an organic EL display device with higher resolution, suppressed power consumption while being driven and low manufacturing cost, and no color mixing and color shifting between subpixels adjacent to each other can be achieved.

In an organic EL display device according to an eleventh aspect of the disclosure, in any one of the first to tenth aspects, a wavelength range of a light-emitting spectrum of the third fluorescence light-emitting material contained in the third fluorescence light-emitting layer and a wavelength range of an absorption spectrum of a first fluorescence light-emitting material contained in the first fluorescence light-emitting layer overlap with each other within a predetermined wavelength range.

According to the configuration, an organic EL display device with higher resolution, suppressed power consumption while being driven and low manufacturing cost, and no color mixing and color shifting between subpixels adjacent to each other can be achieved.

In an organic EL display device according to a twelfth aspect of the disclosure, in any one of the first to eleventh aspects, a wavelength range of an absorption spectrum of the first separation layer preferably do not overlap with the wavelength range of the light-emitting spectrum of the second fluorescence light-emitting material contained in the second fluorescence light-emitting layer.

According to the configuration, an organic EL display device with further higher light-emitting efficiency can be achieved.

In an organic EL display device according to a thirteenth aspect of the disclosure, in any one of the first to twelfth aspects, a wavelength range of an absorption spectrum of the second separation layer preferably do not overlap with the wavelength range of the light-emitting spectrum of the third fluorescence light-emitting material contained in the third fluorescence light-emitting layer.

In an organic EL display device according to a fourteenth aspect of the disclosure, in any one of the first to thirteenth aspects, between the positive electrode and the negative electrode, among the first fluorescence light-emitting layer, the second fluorescence light-emitting layer, and the third fluorescence light-emitting layer, the first fluorescence light-emitting layer is preferably arranged most adjacent to the negative electrode, and the second fluorescence light-emitting layer is preferably arranged most adjacent to the positive electrode, and electron mobility of a material contained at a combination ratio of 50% or higher in a layer formed above the second fluorescence light-emitting layer, and between the second fluorescence light-emitting layer and the negative electrode is preferably higher than hole mobility.

According to the configuration, an organic EL display device with higher light-emitting efficiency can be achieved.

In an organic EL display device according to a fifteenth aspect of the disclosure, in any one of the first to thirteenth aspects, between the positive electrode and the negative electrode, among the first fluorescence light-emitting layer, the second fluorescence light-emitting layer, and the third fluorescence light-emitting layer, the first fluorescence light-emitting layer is preferably arranged most adjacent to the positive electrode, and the second fluorescence light-emitting layer is preferably arranged most adjacent to the negative electrode, and hole mobility of a material contained at a combination ratio of 50% or higher in a layer formed below the second fluorescence light-emitting layer, and between the second fluorescence light-emitting layer and the positive electrode is preferably higher than electron mobility.

According to the configuration, an organic EL display device with higher light-emitting efficiency can be achieved.

In an organic EL display device according to a sixteenth aspect of the disclosure, in any one of the first to thirteenth aspects, between the positive electrode and the negative electrode, among the first fluorescence light-emitting layer, the second fluorescence light-emitting layer, and the third fluorescence light-emitting layer, the first fluorescence light-emitting layer is preferably arranged most adjacent to the negative electrode, and the third fluorescence light-emitting layer is preferably arranged most adjacent to the positive electrode, electron mobility of a material contained at a combination ratio of 50% or higher in a layer formed above the second fluorescence light-emitting layer, and between the second fluorescence light-emitting layer and the negative electrode is preferably higher than hole mobility, and hole mobility of a material contained at a combination ratio of 50% or higher in a layer formed below the second fluorescence light-emitting layer, and between the second fluorescence light-emitting layer and the positive electrode is preferably higher than electron mobility.

According to the configuration, an organic EL display device with higher light-emitting efficiency can be achieved.

In an organic EL display device according to a seventeenth aspect of the disclosure, in the first to thirteenth aspects, between the positive electrode and the negative electrode, among the first fluorescence light-emitting layer, the second fluorescence light-emitting layer, and the third fluorescence light-emitting layer, the first fluorescence light-emitting layer is preferably arranged most adjacent to the positive electrode, and the third fluorescence light-emitting layer is preferably arranged most adjacent to the negative electrode, electron mobility of a material contained at a combination ratio of 50% or higher in a layer formed above the second fluorescence light-emitting layer, and between the second fluorescence light-emitting layer and the negative electrode is preferably higher than hole mobility, and hole mobility of a material contained at a combination ratio of 50% or higher in a layer formed below the second fluorescence light-emitting layer, and between the second fluorescence light-emitting layer and the positive electrode is preferably higher than electron mobility.

According to the configuration, an organic EL display device with higher light-emitting efficiency can be achieved.

In an organic EL display device according to an eighteenth aspect of the disclosure, in any one of the first to seventeenth aspects, with layers layered in the light-emitting layer, the light with peak wavelengths different from each other may be emitted in a direction of increase in film thickness of the light-emitting layer.

According to the configuration, a top-emitting organic EL display device can be achieved.

In an organic EL display device according to a nineteenth aspect of the disclosure, in any one of the first to seventeenth aspects, with layers layered in the light-emitting layer, the light with peak wavelengths different from each other may be emitted in a direction opposite to the direction of increase in film thickness of the light-emitting layer.

According to the configuration, a bottom-emitting type organic EL display device can be achieved.

An organic EL display device manufacturing method, according to a twentieth aspect of the disclosure, is an organic EL display device manufacturing method for producing an organic EL display device including a plurality of pixels each including a first subpixel, a second subpixel, and a third subpixel each configured to emit light with peak wavelengths different from each other. The organic EL display device manufacturing method includes forming a positive electrode, forming a negative electrode, and forming a light-emitting layer. In the forming a light-emitting layer, a first fluorescence light-emitting layer configured to emit light with a longest peak wavelength, a second fluorescence light-emitting layer configured to emit light with a shortest peak wavelength, and a third fluorescence light-emitting layer configured to emit light with a peak wavelength between the longest peak wavelength of the first fluorescence light-emitting layer and the shortest peak wavelength of the second fluorescence light-emitting layer are vapor-deposited over the plurality of pixels to allow the first fluorescence light-emitting layer to lie above or below the second fluorescence light-emitting layer and the third fluorescence light-emitting layer. Between the second fluorescence light-emitting layer and the third fluorescence light-emitting layer, a first separation layer without containing a light-emitting material is separately patterning vapor deposited onto the first subpixel. Between the first fluorescence light-emitting layer and a fluorescence light-emitting layer lying adjacent to the first fluorescence light-emitting layer, a second separation layer without containing a light-emitting material is separately patterning vapor deposited onto the second subpixel.

According to the organic EL display device manufacturing method, the first fluorescence light-emitting layer, the second fluorescence light-emitting layer, and the third fluorescence light-emitting layer are each vapor-deposited over the plurality of pixels. The first fluorescence light-emitting layer, the second fluorescence light-emitting layer, and the third fluorescence light-emitting layer are not formed through separately patterning vapor deposition.

The first separation layer provided in the first subpixel and the second separation layer provided in the second subpixel do not contain a light-emitting material. Therefore, even when a vapor deposition material enters into one of subpixels adjacent to each other, color mixing between the subpixels adjacent to each other does not occur.

As a result, according to the organic EL display device manufacturing method, even when a light-emitting layer is formed through separately patterning vapor deposition, and even when a vapor deposition material enters into one of subpixels adjacent to each other, color mixing between the subpixels adjacent to each other does not occur.

According to the organic EL display device manufacturing method, an organic EL display device configured to allow the first subpixel, the second subpixel, and the third subpixel to emit light with peak wavelengths different from each other through energy transfer between singlet levels in fluorescence light-emitting layers adjacent to each other present within the Förster radius, i.e., the Förster transition, can be produced without causing the first fluorescence light-emitting layer, the second fluorescence light-emitting layer, and the third fluorescence light-emitting layer to wholly emit light simultaneously, suppressing power consumption while being driven.

According to the organic EL display device manufacturing method, an organic EL display device configured to allow the first subpixel, the second subpixel, and the third subpixel to emit light with peak wavelengths different from each other through the Förster transition without requiring a separate color filter can be produced, suppressing manufacturing cost.

According to the organic EL display device manufacturing method, an organic EL display device configured to allow the first subpixel, the second subpixel, and the third subpixel to emit light with peak wavelengths different from each other through the Förster transition can be produced. Even when the first separation layer is formed through separately patterning vapor deposition in a thin film in a subpixel adjacent to the first subpixel, and the second separation layer is formed through separately patterning vapor deposition in a thin film in a subpixel adjacent to the second subpixel, the first subpixel, the second subpixels, and the third subpixels can emit light with peak wavelengths different from each other. The reason is that the Förster transition occurs as long as the fluorescence light-emitting layers lie within the Förster radius, even when the fluorescence light-emitting layers are not in direct contact with each other.

As a result, in separately patterning vapor deposition for forming the first separation layer and the second separation layer, a greater process margin can be achieved.

According to the organic EL display device manufacturing method, an organic EL display device configured to allow the first subpixel, the second subpixel, and the third subpixel to emit light with peak wavelengths different from each other through the Förster transition can be produced. As a result, color mixing and color shifting between subpixels adjacent to each other due to light to be emitted obliquely do not occur.

As described above, according to the organic EL display device manufacturing method, the first fluorescence light-emitting layer, the second fluorescence light-emitting layer, and the third fluorescence light-emitting layer are each vapor-deposited over the plurality of pixels. The first fluorescence light-emitting layer, the second fluorescence light-emitting layer, and the third fluorescence light-emitting layer are not formed through separately patterning vapor deposition. In forming of the first separation layer and the second separation layer, a greater process margin can be achieved, without leading to a great increase in size of a manufacturing apparatus and a decrease in efficiency of utilization of a vapor-deposition material.

As described above, according to the organic EL display device manufacturing method, an organic EL display device with higher resolution, suppressed power consumption while being driven and low manufacturing cost, and no color mixing and color shifting between subpixels adjacent to each other, without leading to a great increase in size of a manufacturing apparatus and a decrease in efficiency of utilization of a vapor-deposition material can be produced.

Additional Items

The disclosure is not limited to each of the embodiments stated above, and various modifications may be implemented within a range not departing from the scope of the claims. Embodiments obtained by appropriately combining technical approaches stated in each of the different embodiments also fall within the scope of the technology of the disclosure. Moreover, novel technical features may be formed by combining the technical approaches stated in each of the embodiments.

INDUSTRIAL APPLICABILITY

The disclosure can be used for an organic EL display device and an organic EL display device manufacturing method.

REFERENCE SIGNS LIST

1 Organic EL display device
2 Substrate
5 Hole injection layer
6 Hole transport layer
7 Common blue-light-emitting layer (second fluorescence light-emitting layer)
7a Common blue-light-emitting layer (second fluorescence light-emitting layer)
7b Common blue-light-emitting layer (second fluorescence light-emitting layer)
8 First separation layer
8a First separation layer
8b First separation layer 8e First separation layer
9 Common green-light-emitting layer (third fluorescence light-emitting layer)
9a Common green-light-emitting layer (third fluorescence light-emitting layer)
9b Common green-light-emitting layer (third fluorescence light-emitting layer)
9c Common green-light-emitting layer (third fluorescence light-emitting layer)
10 Second separation layer
10a Second separation layer
10b Second separation layer
10e Second separation layer
11 Common red-light-emitting layer (first fluorescence light-emitting layer)
11b Common red-light-emitting layer (first fluorescence light-emitting layer)
12 Electron transport layer
13 Electron injection layer
21 Organic EL display device
31 Organic EL display device
37 First layer (first separation layer)
38 Second layer (first separation layer)
41 Organic EL display device
45 Block layer (first block layer or second block layer)
47 Block layer (first block layer or second block layer)
51 Organic EL display device
52 Organic EL display device
53 Organic EL display device
56 Hole transport layer
62 Electron transport layer
71 Organic EL display device
81 Organic EL display device
91 Organic EL display device

The invention claimed is:

1. An organic electro luminescence (EL) display device comprising:
a plurality of pixels each including:
a first subpixel;
a second subpixel; and
a third subpixel,
the first, second, and third subpixels being configured to emit light with peak wavelengths different from each other, and
the first, second, and third subpixels each including:
a positive electrode;
a negative electrode; and
a light-emitting layer formed between the positive electrode and the negative electrode,
wherein either of the positive electrode and the negative electrode is a reflective electrode or includes a reflective layer, and another of the positive electrode and the negative electrode is a transparent electrode or a translucent electrode configured to transmit the light with peak wavelengths different from each other,
the light-emitting layer is a layered film including:
a first fluorescence light-emitting layer configured to emit light with a longest peak wavelength;
a second fluorescence light-emitting layer configured to emit light with a shortest peak wavelength; and
a third fluorescence light-emitting layer configured to emit light with a peak wavelength between the longest peak wavelength of the first fluorescence light-emitting layer and the shortest peak wavelength of the second fluorescence light-emitting layer,
the first fluorescence light-emitting layer, the second fluorescence light-emitting layer, and the third fluorescence light-emitting layer are each formed as a single common layer in the plurality of pixels,
the first fluorescence light-emitting layer is arranged above or below the second fluorescence light-emitting layer and the third fluorescence light-emitting layer,
in the first subpixel, a first separation layer without including a light-emitting material is provided between the second fluorescence light-emitting layer and the third fluorescence light-emitting layer, and
in the second subpixel, a second separation layer without containing a light-emitting material is provided between the first fluorescence light-emitting layer and a fluorescence light-emitting layer lying adjacent to the first fluorescence light-emitting layer.

2. The organic EL display device according to claim 1, wherein
the first fluorescence light-emitting layer is a light-emitting layer for red light,
the second fluorescence light-emitting layer is a light-emitting layer for blue light, and
the third fluorescence light-emitting layer is a light-emitting layer for green light.

3. The organic EL display device according to claim 1, wherein at least either of the first separation layer and the second separation layer is a layered film of a plurality of layers.

4. The organic EL display device according to claim 1, wherein the first separation layer has a film thickness ranging from 15 nm to 50 nm, both inclusive.

5. The organic EL display device according to claim 1, wherein the second separation layer has a film thickness ranging from 15 nm to 50 nm, both inclusive.

6. The organic EL display device according to claim 1, wherein a third fluorescence light-emitting material contained in the third fluorescence light-emitting layer contains a thermally activated delayed fluorescence material with an energy difference of less than 0.3 eV between a minimum excited singlet level and a minimum excited triplet level.

7. The organic EL display device according to claim 1, wherein a second block layer without containing a light-emitting material is formed between the second fluorescence light-emitting layer and the third fluorescence light-emitting layer as a single common layer in the plurality of pixels, and
in the first subpixel, a film thickness of the first separation layer and the second block layer ranges from 15 nm to 50 nm, both inclusive.

8. The organic EL display device according to claim 1, wherein a wavelength range of a light-emitting spectrum of the second fluorescence light-emitting material contained in the second fluorescence light-emitting layer and a wavelength range of an absorption spectrum of the third fluorescence light-emitting material contained in the third fluorescence light-emitting layer overlap with each other within a predetermined wavelength range.

9. The organic EL display device according to claim 1, wherein a wavelength range of a light-emitting spectrum of the third fluorescence light-emitting material contained in the third fluorescence light-emitting layer and a wavelength range of an absorption spectrum of a first fluorescence light-emitting material contained in the first fluorescence light-emitting layer overlap with each other within a predetermined wavelength range.

10. The organic EL display device according to claim 1, wherein a wavelength range of an absorption spectrum of the first separation layer does not overlap with the wavelength range of the light-emitting spectrum of the second fluorescence light-emitting material contained in the second fluorescence light-emitting layer.

11. The organic EL display device according to claim 1, wherein a wavelength range of an absorption spectrum of the second separation layer does not overlap with the wavelength range of the light-emitting spectrum of the third fluorescence light-emitting material contained in the third fluorescence light-emitting layer.

12. The organic EL display device according to claim 1, wherein, between the positive electrode and the negative electrode, among the first fluorescence light-emitting layer, the second fluorescence light-emitting layer, and the third fluorescence light-emitting layer, the first fluorescence light-emitting layer is arranged most adjacent to the negative electrode, and the second fluorescence light-emitting layer is arranged most adjacent to the positive electrode, and electron mobility of a material contained at a combination ratio of 50% or higher in a layer formed above the second fluorescence light-emitting layer, and between the second fluorescence light-emitting layer and the negative electrode is higher than hole mobility.

13. The organic EL display device according to claim 1, wherein, between the positive electrode and the negative electrode, among the first fluorescence light-emitting layer, the second fluorescence light-emitting layer, and the third fluorescence light-emitting layer, the first fluorescence light-emitting layer is arranged most adjacent to the positive electrode, and the second fluorescence light-emitting layer is arranged most adjacent to the negative electrode, and hole mobility of a material contained at a combination ratio of 50% or higher in a layer formed below the second fluorescence light-emitting layer, and between the second fluorescence light-emitting layer and the positive electrode is higher than electron mobility.

14. The organic EL display device according to claim 1, wherein, between the positive electrode and the negative electrode, among the first fluorescence light-emitting layer, the second fluorescence light-emitting layer, and the third fluorescence light-emitting layer, the first fluorescence light-emitting layer is arranged most adjacent to the negative electrode, and the third fluorescence light-emitting layer is arranged most adjacent to the positive electrode, electron mobility of a material contained at a combination ratio of 50% or higher in a layer formed above the second fluorescence light-emitting layer, and between the second fluorescence light-emitting layer and the negative electrode is higher than hole mobility, and hole mobility of a material contained at a combination ratio of 50% or higher in a layer formed below the second fluorescence light-emitting layer, and between the second fluorescence light-emitting layer and the positive electrode is higher than electron mobility.

15. The organic EL display device according to claim 1, wherein, between the positive electrode and the negative electrode, among the first fluorescence light-emitting layer, the second fluorescence light-emitting layer, and the third fluorescence light-emitting layer, the first fluorescence light-emitting layer is arranged most adjacent to the positive electrode, and the third fluorescence light-emitting layer is arranged most adjacent to the negative electrode, electron mobility of a material contained at a combination ratio of 50% or higher in a layer formed above the second fluorescence light-emitting layer, and between the second fluorescence light-emitting layer and the negative electrode is higher than hole mobility, and hole mobility of a material contained at a combination ratio of 50% or higher in a layer formed below the second fluorescence light-emitting layer, and between the second fluorescence light-emitting layer and the positive electrode is higher than electron mobility.

16. The organic EL display device according to claim 1, wherein, with layers layered in the light-emitting layer, the light with peak wavelengths different from each other is emitted in a direction of increase in film thickness of the light-emitting layer.

17. The organic EL display device according to claim 1, wherein, with layers layered in the light-emitting layer, the light with peak wavelengths different from each other is emitted in a direction opposite to the direction of increase in film thickness of the light-emitting layer.

18. An organic electro luminescence (EL) display device manufacturing method for producing an organic EL display device including a plurality of pixels each including a first subpixel, a second subpixel, and a third subpixel, the first, second, and third subpixels being configured to emit light with peak wavelengths different from each other, the organic EL display device manufacturing method comprising:

forming a positive electrode;

forming a negative electrode; and forming a light-emitting layer, wherein, in the forming a light-emitting layer, a first fluorescence light-emitting layer configured to emit light with a longest peak wavelength, a second fluorescence light-emitting layer configured to emit light with a shortest peak wavelength, and a third fluorescence light-emitting layer configured to emit light with a peak wavelength between the longest peak wavelength of the first fluorescence light-emitting layer and the shortest peak wavelength of the second fluorescence light-emitting layer are vapor-deposited over the plurality of pixels to allow the first fluorescence light-emitting layer to lie above or below the second fluorescence light-emitting layer and the third fluorescence light-emitting layer, between the second fluorescence light-emitting layer and the third fluorescence light-emitting layer, a first separation layer without containing a light-emitting material is separately patterning vapor deposited onto the first subpixel, and between the first fluorescence light-emitting layer and a fluorescence light-emitting layer lying adjacent to the first fluorescence light-emitting layer, a second separation layer without containing a light-emitting material is separately patterning vapor deposited onto the second subpixel.

* * * * *